United States Patent [19]
Terrell

[11] Patent Number: 5,500,874
[45] Date of Patent: Mar. 19, 1996

[54] DIGITAL FILTERING, DATA RATE CONVERSION AND MODEM DESIGN

[75] Inventor: Peter M. Terrell, Cambridge, United Kingdom

[73] Assignee: Signal Processors Limited, Cambridge, United Kingdom

[21] Appl. No.: 187,464

[22] Filed: Jan. 28, 1994

[30] Foreign Application Priority Data

Jan. 28, 1993 [GB] United Kingdom ............... 9301704

[51] Int. Cl.$^6$ ............................. H03H 7/30; H03H 7/40
[52] U.S. Cl. ................... 375/232; 375/350; 364/724.1
[58] Field of Search ..................... 375/11–14, 97, 375/99–103; 370/84; 333/18, 28 R; 364/724.2, 724.01, 724.1

[56] References Cited

U.S. PATENT DOCUMENTS

| | | | |
|---|---|---|---|
| 4,021,738 | 5/1977 | Gitlin et al. | 375/14 |
| 4,599,732 | 7/1986 | LeFever | 375/101 |
| 4,856,030 | 8/1989 | Batzer et al. | 375/8 |
| 4,953,184 | 8/1990 | Simone. | |
| 5,311,546 | 5/1994 | Paik et al. | 375/14 |

FOREIGN PATENT DOCUMENTS

| | | |
|---|---|---|
| 222593A3 | 5/1987 | European Pat. Off.. |
| 323200 | 7/1989 | European Pat. Off.. |
| 356597 | 3/1990 | European Pat. Off.. |

OTHER PUBLICATIONS

Sampleport Stereo Asynchronous Sample Rate Converters, AD1890/AD1891, Analog Devices, pp. 1–20.

*Primary Examiner*—Stephen Chin
*Assistant Examiner*—Don Vo
*Attorney, Agent, or Firm*—Lowe, Price, LeBlanc & Becker

[57] ABSTRACT

A digital filter 23 receives a control signal which specifies what filter coefficient values should be used. The control signal can be changed repeatedly so as to dynamically select the coefficients in response to the value of a control parameter. The filter 23 can be configured as a data rate converting filter in which the control signal represents the current phase relationship between the input data stream and the output data stream. The phase control signal can be provided as the phase output of a numerically controlled oscillator 67 having an oscillation frequency which is a multiple of one of the data rates and which is clocked at a multiple of the frequency of the other data rate. The data rate converter can be used as part of a data modulator or demodulator, thereby allowing an analog-to-digital converter 19 or a digital-to-analog converter 143 of the modulator or demodulator to run at a fixed arbitrary frequency substantially regardless of the data rate of modulated symbols.

77 Claims, 13 Drawing Sheets

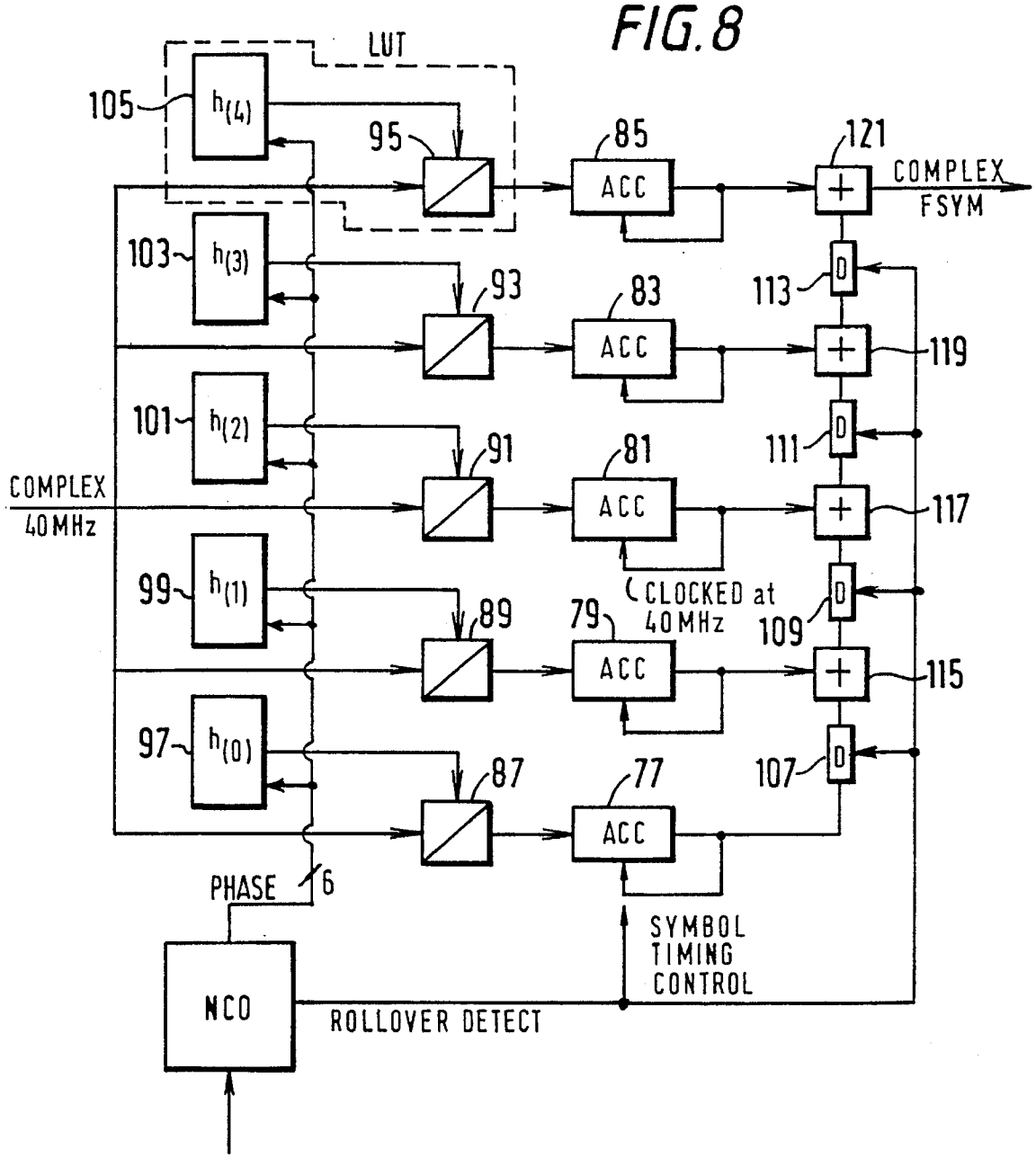
FIG. 8
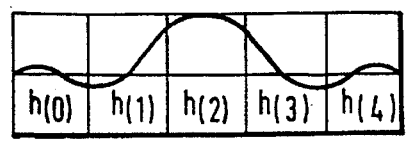

DIGITAL FILTERING, DATA RATE CONVERSION AND MODEM DESIGN

BACKGROUND OF THE INVENTION

1. Field of the Invention

The present invention relates to a digital filter and a method of digital filtering, a digital data rate converter and a method of digital data rate conversion, and a method and apparatus for modulating and/or demodulating a digital signal.

2. Description of the Prior Art

In a typical finite impulse response digital filter, an output sample is obtained by obtaining the product of an input sample and a coefficient and combining that product with one or more products of other input samples with respective coefficients so that each output sample is made up of contributions from several input samples and each input sample contributes to a corresponding number of output samples. In an infinite impulse response digital filter, an output sample is obtained by obtaining the product of an input sample and a coefficient and combining this with one or more products of preceding output samples and corresponding coefficients, and normally also one or more products of other input samples and corresponding coefficients. The values of the coefficients in such a filter represent the shape of the impulse response.

In a known digital filtering technique for changing the data rate of digital samples, the digital sample stream is passed through an interpolation filter and then through a decimation falter. The interpolation filter increases the digital sample rate by an integer value so as to provide a digital data stream having a data rate which is a common multiple of the input data rate and the desired output data rate (often the lowest common multiple). The interpolation falter has to generate the additional sample values required, and may do this by interpolating between input sample values. The decimation filter receives the increased rate signal and reduces its data rate by an integer value to obtain the desired output data rate, by passing only an appropriate proportion of its input data samples to its output. Thus, if for example a data rate of 50 samples per second is converted to 30 samples per second, the interpolation filter triples the number of samples to provide a digital data stream at 150 samples per second, and the decimation filter receives the signal at 150 samples per second and outputs every 5th sample so as to provide a data stream at 30 samples per second. The choice of data rate conversions which can be performed with such a technique is limited by the need to obtain a sample rate for the data stream between the two filters which is a common multiple of the desired input and output sample rates.

In apparatus for modulating a data signal onto a carrier, or apparatus for demodulating such a signal to recover the data, or an apparatus which performs both functions (all of which will be referred to generically as a modem in the present specification), it is often convenient for part of the modulating or demodulating procedure to be carried out digitally. Normally, it will be desirable to have a stream of digital samples representing data symbols modulated onto the carrier signal, at a sample rate which is substantially greater than the rate at which data symbols appear in the data to be modulated onto or demodulated from the carrier (the symbol rate). In a demodulator, the samples will be obtained from an input analog signal representing the modulated carrier by an analog-to-digital converter and in a modulator the digital samples will be converted into an analog modulated carrier signal by a digital-to-analog converter.

At some point in the processing of the digital signals within the modem, it will be necessary to convert the digital data rate between the sample rate for the ADC or DAC and the symbol rate of the data modulated on the carrier. In order to provide a practical modem design, the ADC or DAC may be driven by a clock to define a sample rate which is an integer multiple of the symbol rate, so that for demodulation the sample rate is converted to the symbol rate by a decimation filter and for modulation the symbol fate is converted to the sample rate by interpolation. The sample rate can instead be a rational non-integer multiple of the symbol rate, in which case both a decimation filter and an interpolation filter will be required. In either case, the clock rate for the ADC or the DAC must be chosen with reference to the symbol rate (or the baud rate) at which the modem is intended to operate, and for a modem capable of operating at several rates it will normally be necessary to provide an arrangement for controlling and selecting the ADC or DAC clock rate in accordance with the symbol rate being used at any particular time.

SUMMARY OF THE INVENTION

According to one aspect of the present invention there is provided a digital filter for receiving an ordered stream of input digital samples and providing an ordered stream of output digital samples, the filter generating each of the output samples from a plurality of products between a respective input sample and a respective coefficient value, and comprising means to select the coefficients used in generating any particular output sample from a plurality of predetermined values. The actual values for the coefficients are not necessarily stored within the filter. For example, the filter may store sets of products of coefficients and possible input sample values, so that a product value is selected for use in generating an output sample on the basis of the value of the input sample and the selection of which coefficient value is required.

This arrangement allows a dynamic re-selection of the digital filter properties on a sample-by-sample basis.

One use for such a digital filter is in providing a digital filter in which the output sample rate is different from the input sample rate. For each output sample, the coefficients can be selected on the basis of the phase between the input sample clock and the output sample clock, in order to provide a filtering characteristic suitable for that phase offset. Since the coefficients to be used can be changed at any time, the filter characteristics can respond adaptively to changes in the phase between the input sample rate and the output sample rate, and the means for controlling the selection of coefficients can be set up to keep track of this phase difference. In this way, the filter can operate with an input sample rate and an output sample rate which are not related by a simple ratio.

In one embodiment, the coefficients used in generating an output sample are re-selected for each output sample. In another embodiment, the coefficients which are used with a given input sample are re-selected for each input sample.

Using a digital filter of this type, it is possible to construct a digital data rate converting apparatus in which the output signal rate is substantially independent of the input signal rate, or vice versa. If such a data rate converter is used in the design of a modem, the modem can be constructed such that the sample rate for digital samples at the ADC or DAC is substantially independent of the symbol rate of the data being modulated onto or demodulated from the carrier. Accordingly, it becomes possible to construct a modem in which the clock rate for the ADC or DAC may be fixed at a convenient arbitrary value, and does not have to be selected as an integer multiple of the symbol rate. If the baud rate of the modem is altered, this will normally imply changing the input rate for the data rate converter in the case of a modulator or changing the output data rate in the case of a demodulator, without requiring any change in the clock rate for the ADC or DAC. In this way, the clock rate control circuitry for the ADC and DAC can be substantially simplified, and clock rate variation circuitry may be unnecessary.

Depending on the application, it is not always necessary to provide clock signals at both sample rates to the data rate converting apparatus. As is illustrated in an embodiment, a demodulating modem can be constructed in which the degree of the phase error in the output symbols is detected and this is used in a feedback control loop to lock the operation of the digital filter to provide output values at the symbol rate with the correct phase. In this arrangement, the symbol clock data is obtained from the output of the filter itself, and no externally supplied symbol clock is required by the data rate converter.

Although a data rate converter using a digital filter according to the present invention is described as used in a modem, other uses are possible. For example, where a digital data train represents a continuously varying analog signal, and it is desired for any reason to a digital representation of that analog signal at a different digital data rate, a digital data rate converter can be used. Such a requirement may exist, for example, in converting between different digital video formats with different numbers of pixels per line, or converting digitally recorded audio between different standards having different data rates.

In another aspect the present invention relates to a gain control circuit in which an error signal representing the difference between the output signal level and the desired output signal level is multiplied by a factor which is derived from the value of the gain, before being added to the gain to obtain a new gain level. In this way, for a given level of error in the output signal level, the rate at which the gain changes depends on the level of the gain. This arrangement can be used to reduce the extent to which the time constant of the automatic gain control circuit depends on the level of the signal gain. Otherwise, the reaction of the AGC circuit to a given error in the level of the output signal will be faster if the error is caused by a change in a strong signal subjected to Low gain than in the case where the error is due to the same change in dB (a smaller change in absolute signal level) in a weak signal subjected to a strong gain.

In a further aspect of the present invention there is provided a circuit for determining a phase error or a frequency error in an input signal, or a phase-locked-loop (PLL) or a frequency-locked-loop (FLL) using such a circuit, in which an offset is added to a generated scalar quantity representing the degree of detected error, and a substantially cancelling alteration is made to the input signal before or during processing while it is still a vector quantity, e.g. by rotating the input signal, thereby to eliminate (at least partially) the offset in the error signal when the input signal has a detectable phase or frequency, but to allow the offset to appear in the error signal when the input signal comprises substantially entirely random noise.

Such offsets in the error signal are typically used in a PLL or FLL to cause the output of an oscillator controlled by the error signal to "sweep" through a range of oscillation signals. Where the loop is supposed to lock to an external signal in order to derive an output from which the input to the phase or frequency error detector is obtained, the loop will only lock properly to the external signal if the oscillator output is sufficiently close to the correct phase or frequency that the output signal is provided. In this case, an offset in the error signal controlling the oscillator will cause the oscillator to change frequency at a rate depending on the level of the offset, until the oscillator frequency becomes such that an output signal is obtained and the phase or frequency or error detector outputs a non-zero error signal.

However, the oscillator output frequency will not cease to change until the magnitude of the error signal output by the phase or frequency error detector cancels the offset. Therefore, unless the phase or frequency error detector is arranged to compensate for the offset, the loop will settle with a phase or frequency error having a magnitude in accordance with the value of the offset. If the phase or frequency error represented by the value of the offset is so large that an output signal cannot be obtained, the loop will not settle at all without compensation for the effect of the offset. This means that, in the absence of compensation for the effect of the offset, there is a limit to the magnitude of the offset signal which can be used, and accordingly there is a limit to the rate at which the oscillator can "sweep" or change frequency, searching for the external signal.

It is not possible simply to compensate for the offset signal by subtracting a corresponding value from the output of the phase or frequency error detector, since this would eliminate the effect of the offset on the oscillator in the absence of a signal as well as in the presence of a signal, and the oscillator would not sweep. By applying the compensation as a suitable alteration to the input signal while it is still in vector form, the compensation has substantially no effect on the output of the error detector when only noise is input (phase rotated noise is still noise), but when a signal is input the output of the error detector is altered so as to compensate for the offset, In this way, the effect of the offset is compensated for when a signal is detected but is not compensated for when only noise is input to the phase or frequency detector.

BRIEF DESCRIPTION OF THE DRAWINGS

Embodiments of the present invention, given by way of non-limiting example, will now be described with reference to the accompanying drawings, in which:

FIG. 8 illustrates a data rate converting filter architecture for the demodulating modem of FIG. 4;

DESCRIPTION OF THE PREFERRED EMBODIMENTS

Figure 1:
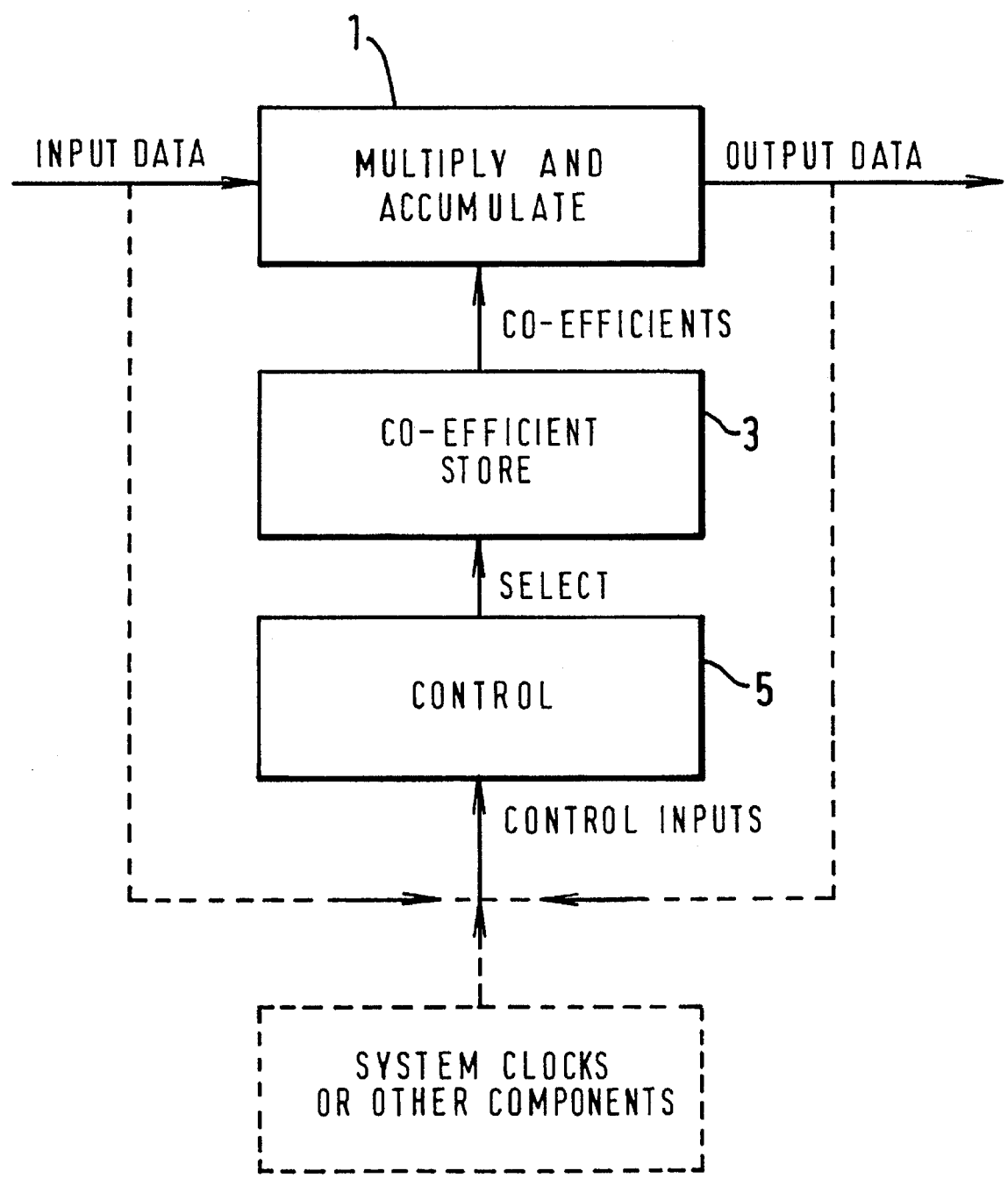
FIG. 1 illustrates the conceptual architecture of a digital filter with dynamically controllable selection of coefficients.

FIG. 1 illustrates conceptually the construction of a digital filter embodying the present invention, although as is explained later the actual construction of the filter may be different. In the conceptual structure of FIG. 1, input data values are used to obtain output data values in a calculation unit 1. To generate each output data value, the calculation unit multiplies a plurality of input data values by respective coefficients and accumulates the results, in the manner of a Finite Impulse Response (FIR) filter, and may also multiply one of more previous output data values by respective coefficients and accumulate these with the accumulated products of input data values in the manner of an Infinite Impulse Response (IIR) filter. For each calculation, the calculation unit uses a coefficient value supplied to it from a coefficient store 3. The coefficient store 3 supplies coefficients in accordance with the coefficient select signal from a control unit 5. The control unit 5 decides which coefficients should be selected from the coefficient store 3 and provided to the calculation unit 1 for each calculation. The control unit 5 responds to control inputs, and accordingly it can select the coefficients to be used at any given instant dynamically on the basis of the values of the control inputs. In principle, any signals could provide the control inputs depending on the use to which the filter is to be put, and typically these will be obtained from the input data or the output data, or from blocks or other components in the system containing the digital filter. The control unit 5 may receive more than one control input signal, and may for example output select signals on the basis of comparisons between the current values or current phases of different control inputs.

In practice, the use of a look-up table in memory to replace circuits for conducting logical operations may enable the coefficient store 3 to be combined with one of the other units of the filter.

There will now be described how such a digital filter with dynamically variable coefficients can be used to provide a data rate converter for a digital data stream.

Figure 2:
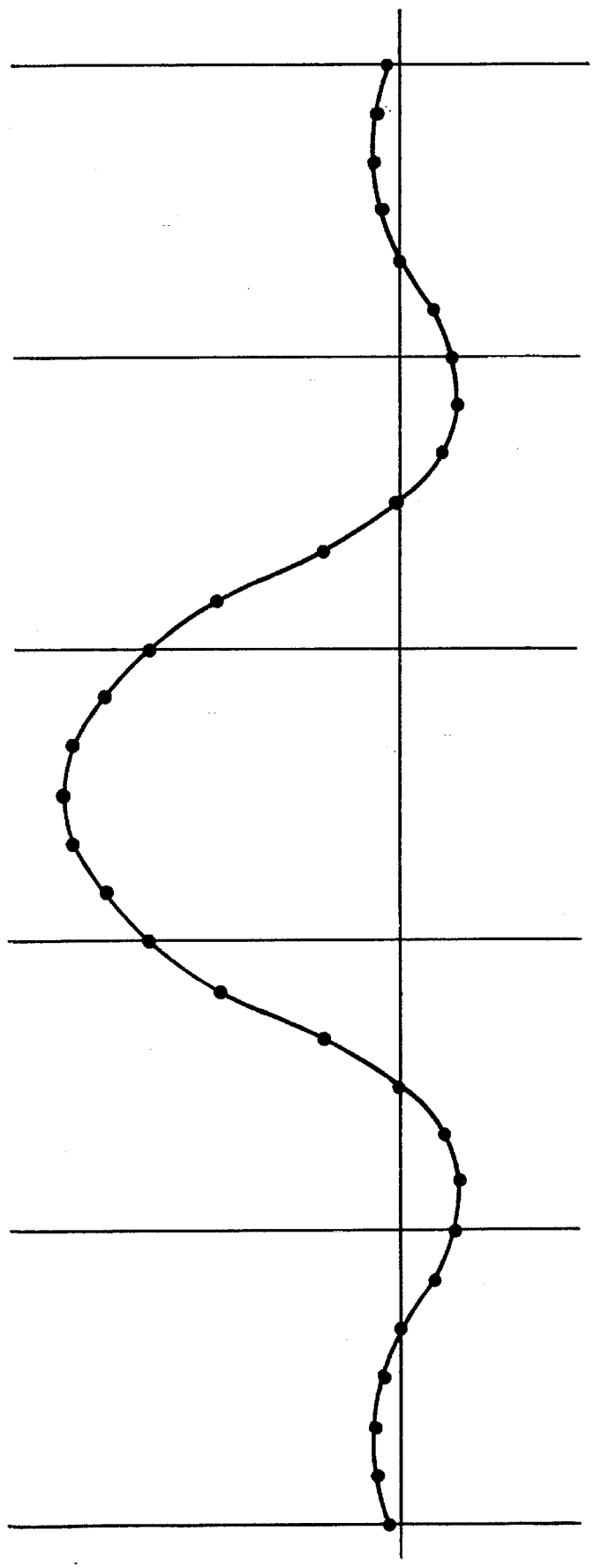
FIG. 2 illustrates a finite impulse response for a filter.

In a data rate converter embodying the present invention, the digital filter is used as an FIR filter, and FIG. 2 shows an example of a finite impulse response for such a filter. The impulse response of FIG. 2 is shown as extending over 5 output data periods. In the use of the filter, an output data value will be obtained by multiplying a succession of input data values with respective coefficients representing the impulse response, and accumulating the products of these multiplications. Ideally, the peak of the impulse response should be centred on the output data period, while the coefficient used to multiply each input data value should represent the value of the impulse response at the precise timing of the input sample. In practice, if the data rate converter is to cope with any possible phase relationship between the input data values and the output data values and is to cope with any possible ratio of any input data rate to output data rate within an operating range of ratios, the filter could only meet both of these criteria simultaneously by having an infinite number of coefficients representing infinitely fine sampling of the impulse response curve.

In the operation of the data rate converter embodying the present invention, coefficient values for a finite number of positions along the impulse response are calculated, and for any given operation of obtaining the product between an input data value and a coefficient, the control means instructs the use of whichever of the available coefficient values gives a good approximation to the instantaneous value at the input data-timing of the impulse response when centred on the output value period.

The more coefficient values there are to choose from, the less error will be introduced by using a coefficient value which is only approximately correct. The number of coefficient values necessary on any particular occasion will vary depending on the use to which the data rate converter is being put. In the case of a modem for converting between unmodulated digital data and data modulated on a radio carrier for satellite transmission, it has been found to be sufficient to provide approximately 64 ($2^6$) coefficients per unmodulated data symbol period. Normally, in operation of a demodulator it has been found that clock jitter and phase uncertainty in the recovered symbol clock means that the symbol clock phase can only be determined with a certainly of approximately 1 part in 16 ($2^4$), so that errors introduced by approximate coefficient values when there are 64 coefficients per symbol period are negligible compared with errors introduced by uncertainly about the symbol clock.

In one data rate converter and demodulator embodying the present invention, the impulse response curve is sampled in phase with the symbol period, to provide precisely 64 samples per symbol period. In a second data rate converter and a second demodulator, the impulse response is sampled at a multiple of the frequency of the data samples digitised from the modulated carrier signal and input of the data rate converter so that there will not be exactly 64 samples per symbol period but the rate at which the impulse response is sampled is selected so as to provide approximately this number of samples.

Figure 3:
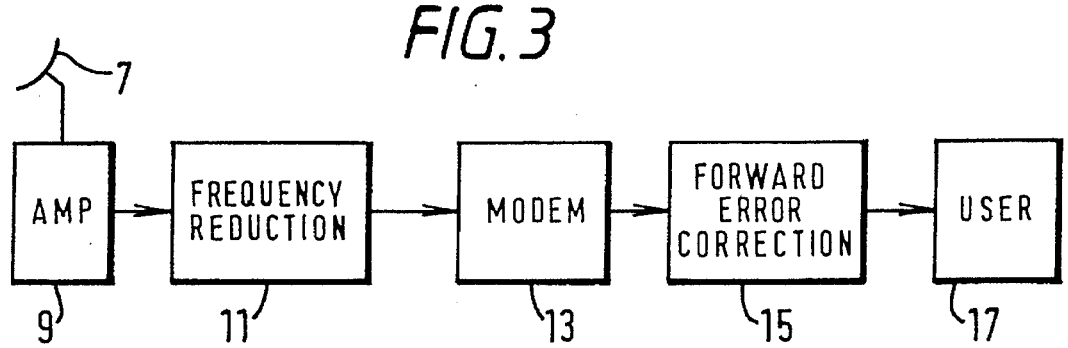
FIG. 3 shows schematically a satellite signal receiver and demodulator system.

FIG. 3 illustrates a receiving apparatus for receiving digital data signals transmitted by a satellite, demodulating the signals, and forwarding the digital data to a user. In FIG. 3 signals from the satellite are received by a dish antenna 7 and amplified in an amplifier 9. The frequency of the received signals (i.e. the carrier frequency) is reduced by a frequency reduction circuit 11, and the signals are then input into a demodulating modem 13. The signals between the dish antenna 7 and the modem 13 are high frequency alternating analog waveforms modulated in accordance with digital symbols. Although amplitude modulation is sometimes used, frequency shift modulation or phase shift modulation is more common. The modem 13 demodulates the waveform input to it, and outputs a string of digital values representing the demodulated symbols. If the modulation of the carrier is binary, each symbol value output by the modem should represent one of two possible binary values. In practice, satellite transmissions often use quaternary or octal modulation, in which each symbol can have 4 or 8 possible values. The output from the modem 13 is provided to a forward error correction circuit 15, which carries out any suitable known error correction operation of the data, then the data is passed to the user 17. Depending on the nature of the data, the user might be a telephone network, a computer, a data recorder, etc.

The nature of the data output by the modem 13 will normally be determined by the requirements of the circuitry downstream of it, such as the forward error correction unit 15. Normally, the modem 13 will output 8-bit digital values, so as to provide the FEC 15 with much more detailed information about the value of the received symbol than simply indicating which permitted data value it is closest to. This enables the FEC unit 15 to provide better error correction than if it received only a decoded bit stream from the modem 13. Additionally, depending on the requirements of the FEC unit 15, the modem 13 may output digital values at the symbol rate or may alternatively output values at a multiple of the symbol rate, typically twice the symbol rate, for example in order to provide the FEC unit 15 or the internal synchronisation circuits in the modem 13 with the data value at each boundary between symbol periods as well as the data value in the middle of each data period.

Figure 4:
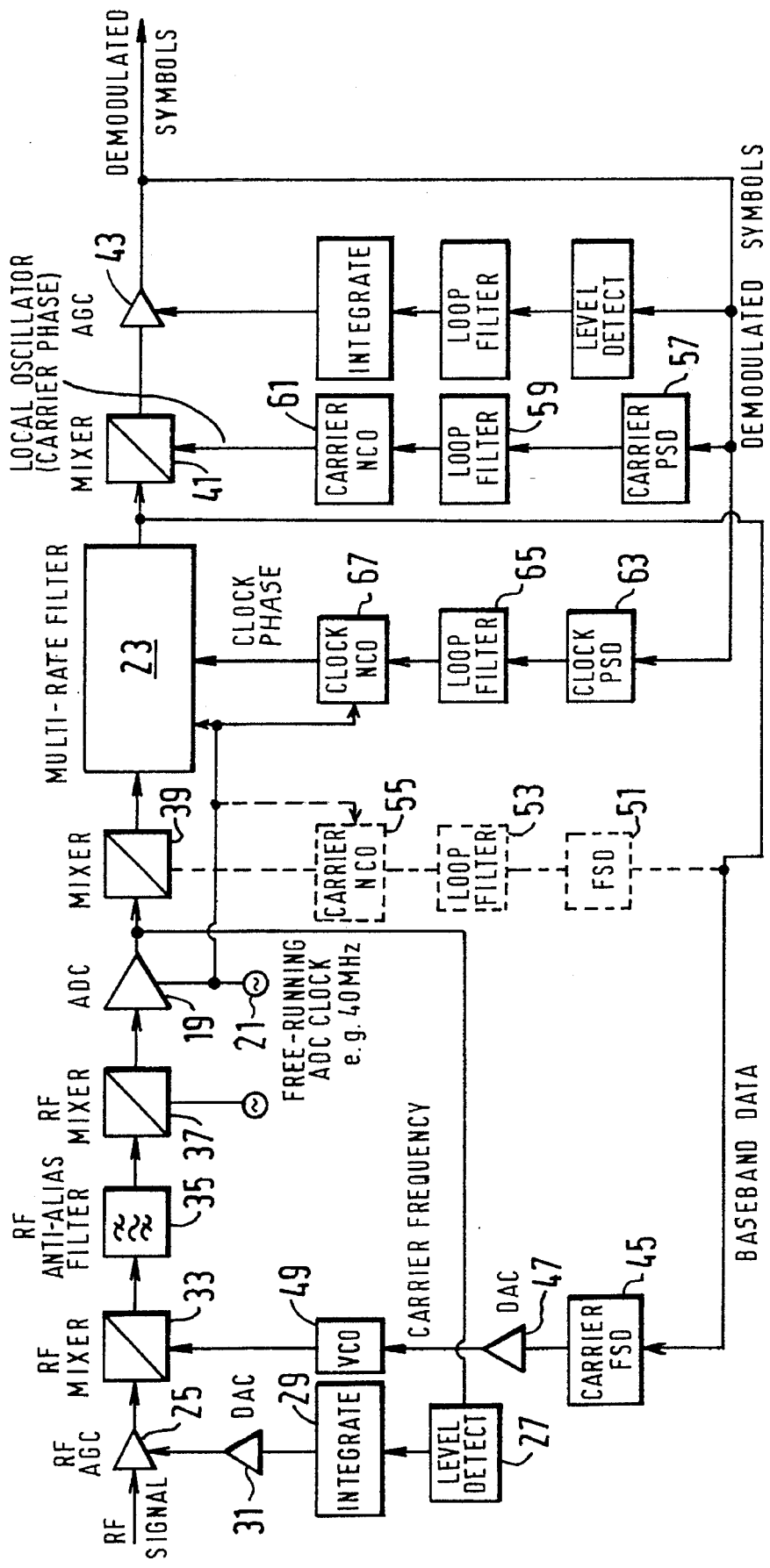
FIG. 4 shows a demodulating modem architecture embodying the present invention.

FIG. 4 is a diagram of the circuit of the demodulating modem 13 of FIG. 3.

In the modem of FIG. 4 the incoming modulated carrier signal is digitised in an analog-to-digital converter 19 to provide a string of digital samples at a rate (the sample rate) determined by its clock 21. The data rate of the digital samples is converted from the sample rate to the rate at which symbols appear modulated onto the carrier (the symbol rate) or to a multiple of the symbol rate if required by downstream circuitry, by a data rate converting filter 23. Interleaved with this process, a series of mixers step down the frequency of the carrier signal, until it is removed altogether and only the modulating signal (the data) remains. In more detail, the operation of the demodulating modem is as follows.

The incoming radio frequency signal is amplified in an automatic gain control circuit 25. The AGC 25 is controlled by feedback from the output of the ADC 19, using a level detector 27, an integrator 29 and a digital-to-analog converter 31, to condition the level of the radio frequency signal to meet the input requirements of the ADC 19. The frequency of the carrier is then stepped down by a radio frequency mixer 33 so as to meet the input requirements of a band pass radio frequency anti-aliassing filter 35. The carrier frequency is then reduced by a second radio frequency mixer 37 to a frequency suitable for digitising by the ADC 19 (e.g. to ensure theft the clock rate of the ADC 19 meets the Nyquist criterion).

A first digital mixer 39 substantially removes the remaining carrier frequency from the digital samples to reduce them to base band before they are input to the data rate converting filter 23. The digital values input to the data rate converting filter 23 may be real or complex values, although the carrier frequency of the signal is approximately 0. The data rate converting filter 23 converts the data rate of real component values and imaginary component values in parallel if the signal is complex. The construction operation of the data rate converting filter 23 are described below with reference to converting a single series of input sample values, and in practice for complex signals the illustrated structure is duplicated in the circuit of FIG. 4 so as to convert the data rate of both real and imaginary data samples. Accordingly, the output of the data converting filter 23 is a real or complex base band digital signal, about at the symbol clock rate (or a multiple thereof).

The base band frequency in the digital signal is finally removed by a second digital mixer 41, and the level of the symbol data is adjusted by a digital automatic gain control 43 before being output, to provide symbol data at a consistent level to the forward error correcting unit 15 and to internal synchronization control loops in the modem 13.

The base band digital data output from the data rate converting filter 23 is also provided to a digital frequency sensitive detector 45 which detects the base band frequency and outputs this as an error signal. The error signal is converted to a voltage in a digital-to-analog converter 47, which is input as the control signal to a voltage controlled oscillator 49 which provides the signal which the first radio frequency mixer 33 mixes into the received signal. Optionally, a second frequency sensitive detector 51 may also detect the base band frequency and output this as an error signal which, after filtering in a loop filter 53, provides the numerical control signal for a numerically controlled oscillator 55. This provides the digital waveform data used by the first digital mixer 39.

The feedback control loop using the base band data to control the voltage centrolled oscillator 49, and the optional loop to control the numerically controlled oscillator 55, act to maintain the base band frequency at substantially zero, even if there are slight variations in the carrier frequency received by the modem 13. Such changes in carrier frequency may arise, for example, from instabilities in the operation of the frequency reduction circuit 11.

In order to ensure that the base band frequency is properly removed from the data by the second digital mixer 41, the demodulated symbols output by the digital AGC 43 are fed to a digital phase sensitive detector 57 which is sensitive to the phase of the carrier or base band component in the demodulated symbols. Any residual phase error is output from the phase sensitive detector 57, filtered in a loop filter 59, and input as a control number to a numerically controlled oscillator 61 providing input oscillation data to the second digital mixer 41. In this way, a phase controlled loop is provided to ensure that the output base band phase error is always zero and the base band frequency error has been eliminated from the signal.

The demodulated symbols output by the digital AGC 43 are also input to a second digital phase sensitive detector 63. This is not sensitive to the phase of the base band component of the digital symbols but is sensitive to the phase of the digital data rate relative to the symbol rate. If the data rate converting filter 23 is operating correctly, the data values output by it should be provided at the symbol frequency (or a multiple thereof) and should be in phase with the data symbols. The second digital phase sensitive detector 63 detects whether these data values really are in phase with the data symbols. Although this could be done by comparing the phase of the received data values with a reconstituted symbol clock, there are alternative ways of recovering this information. For example, if the symbol data is binary and data values are provided at twice the symbol rate, the data values at the boundaries between symbol periods should be half way between the data value for zero and the data value for one between symbol periods having different symbol data values. Whether the data rate output by the filter 23 is the same as the symbol rate or a multiple thereof, a string of data symbols having the same symbol value should provide the same output data value for each symbol. If the first or the last symbol of such a train of similar values is consistently closer to the mid-point between different symbol values than the data value is for other symbols in such a train, this indicates a phase error between the symbol clock and the data output by the filter 23.

In order to reduce processing requirements, the phase sensitive detector 63 may operate at a sub-multiple of the symbol rate.

The output of the second phase sensitive detector 63 is faltered in a loop filter 65 and input as a control number to a further numerically controlled oscillator 67. The phase data from the numerically controlled oscillator 67 is input to the data rate converting filter 23 to control its operation. As wall be explained below, this provides a phase-locked loop which ensures that the data output by the data rate converting filter is in phase with the data symbols.

The operation of a numerically controlled oscillator will now be explained with reference to FIG. 5.

Figure 5:
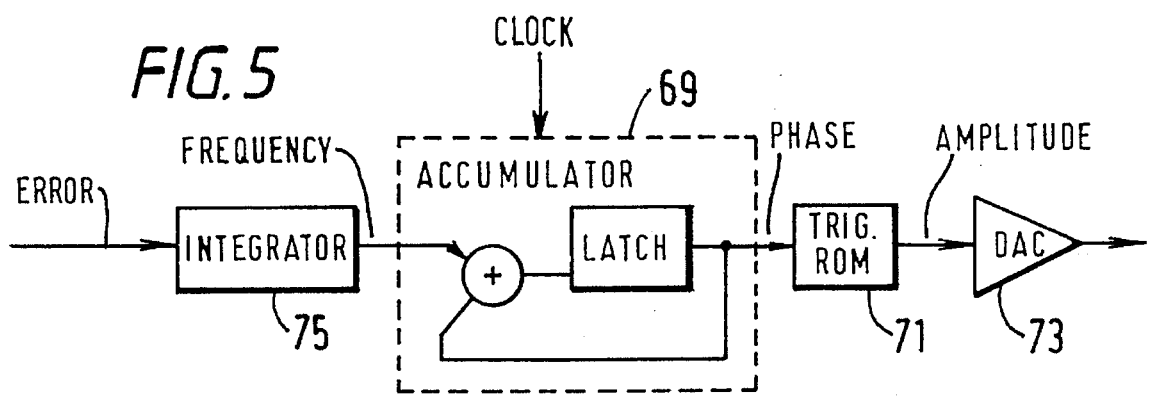
FIG. 5 shows a numerically controlled oscillator.

FIG. 5 illustrates a second order numerically controlled oscillator, which is a digital equivalent to an analog voltage controlled oscillator. The heart of the numerically controlled oscillator is an accumulator 69. This receives an input digital number representing the frequency of oscillation, and this input accumulates under the control of a clock signal. As shown in FIG. 5, the accumulator can be regarded as a latch and an adder, with the adder providing the input to the latch and the output of the latch being fed back to the adder. In each clock period, the number representing the frequency is added to the value in the latch, so that the output value progressively increments by the value of the frequency number. When the adder overflows, the adder operation rolls over and continues unaffected. Accordingly, the output from the accumulator 69 is a number which represents the instantaneous phase of the oscillator, with the value at which the adder overflows representing $2\pi$ in the phase of oscillator, and the frequency with which the adder overflows is the oscillation frequency.

If desired, the output of the accumulator 69 may be provided to a trigonometric ROM 71, which converts the phase position data into waveform data. The output of the trigonometric ROM 71 may be a scalar value represent a predetermined waveform (usually a sine wave), having the same frequency as the overflows of the adder in the accumulator 69. Alternatively, the output of the trigonometric ROM 71 may be a complex value (sine and cosine waves) representing a vector rotating at that frequency. If an analog waveform is required, the data output by the trigonometric ROM 71 is converted by a digital-to-analog converter 73.

The frequency of oscillation is controlled by the frequency of the clock for the accumulator 69 and the value of the frequency number input to the accumulator 69. In a second order numerically controlled oscillator, the frequency number is the output of a digital integrator 75, which can be constructed in the same manner as the accumulator 69, which integrates an input error signal. Accordingly, while the digital error value is zero the frequency value does not change, but a non-zero error value will be integrated so as to change the frequency value until the error value returns to zero.

In practice, the digital-to-analog converter 7.3 may be absent, or both the digital-to-analog converter 73 and trigonometric ROM 71 may be absent, depending on the requirements of the downstream circuitry. In the numerically controlled oscillator 67 which controls the data rate converting filter 23, the digital phase value output from the accumulator 69 is used. In the numerically controlled oscillators 55 and 61 which provide oscillation data for the first and second digital mixers 39 ant 41, either the digital phase value output by the accumulator 69 or the complex digital vector value output by the trigonometric ROM 71 will be used, depending on the requirements of the digital mixing circuit.

Figure 6:
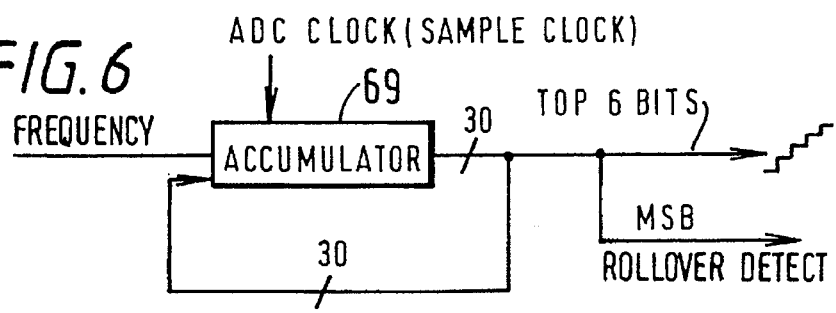
FIG. 6 shows an accumulator of a numerically controlled oscillator, arranged for use in the modem architecture of FIG. 4.
Figure 7:
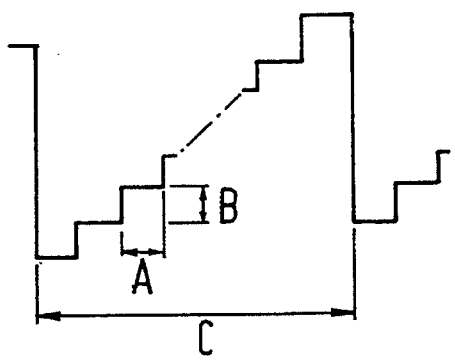
FIG. 7 illustrates the staircase value sequence output from the accumulator of FIG. 6.

FIG. 6 shows the accumulator for the numerically controlled oscillator 67 controlling the data rate converting filter 23, and FIG. 7 shows the accumulator output. The accumulator 69 of a numerically controlled oscillator 67 is clocked by the signal from the sample clock 21, and this same clock signal drives the operation of the data rate converting filter 23. In each clock period of the sample clock 21, the data rate converting filter 23 performs an operation of obtaining the product of a sample value and a coefficient, to accumulate it with other products to develop a symbol value. The digital phase signal from the accumulator 69 of the numerically controlled oscillator 67 acts as the select signal of FIG. 1, to determine which coefficient is to be used in the current operation of obtaining the product. As is shown in FIGS. 6 and 7, the output from the numerically controlled oscillator 67 is a digital representation of a "staircase" waveform. The magnitude of a horizontal part of the waveform (marked A in FIG. 7) represents the time between successive clock signals, and accordingly is equal to the sample period of the digital samples input to the data rate converting filter 23. The height of each vertical in the staircase waveform (marked B in FIG. 7) is equal to the value of the digital frequency number input to the accumulator. When the addition of this number to the value already in the accumulator creates a sum which exceeds the maximum value which can be stored in the accumulator, the accumulator rolls over and stores a low value. The period between successive times when this rollover occurs is marked C in FIG. 7.

The value one greater than the maximum value which can be stored in the accumulator is the modulus of the accumulator. If the sum of a value stored in the accumulator and the input frequency number equals the modulus, the accumulator will rollover and its next output value will be zero. If the sum is greater than the modulus, the accumulator will rollover and output a value equal to the difference between the sum and the modulus. Accordingly, the value output by the accumulator following rollover is not necessarily zero, and it may be different for successive occurrences of rollover. As a result of this, the period C between successive occurrences of rollover (which must always be an integer multiple of the clock period A) may vary from time to time, increasing or decreasing by one period of the sample clock signal.

As shown in FIG. 6, the accumulator 69 of the numerically controlled oscillator 67 stores and outputs a 30-bit word. The top 6-bits of this word are input to the data rate converting filter 23 as the coefficient select signal. Additionally, the most significant bit is also provided as a "rollover detect" signal, since the value of this bit will change from 1 to 0 at rollover. The data rate converting filter 23 outputs a symbol value in response to each "rollover detect" signal. Accordingly, the phase-locked loop provided by the phase sensitive detector 63, the loop filter 65 and the numerically controlled oscillator 67 will act to keep the period c between successive occurrences of rollover to be on average the same as the symbol period. In this way, it can be seen that the frequency and phase of the output from the numerically controlled oscillator 67 are controlled to equal the symbol frequency and phase, and consequently the successive phase values output by the numerically controlled oscillator at each sample clock period represent the phase of the symbol clock at that sample clock period.

FIG. 8 shows the architecture of the data rate converting filter 23. As shown in FIG. 2, this filter filters a digital signal in accordance with an impulse response extending over 5 symbol periods. Accordingly, the filter architecture of FIG. 8 is arranged so that values for 5 symbols are accumulated simultaneously in respect of accumulators 77, 79, 81, 83, 85. Each accumulator accumulates values in respect of a respective symbol period of the impulse response.

Each digital sample received by the data rate converting filter 23 will contribute to the value of one symbol via the final symbol period of the impulse response, the next symbol through the penultimate symbol period of the impulse response, the next symbol through the middle symbol period of the impulse response, the next symbol through the second symbol period of the impulse response, and the next symbol through the first symbol period of the impulse response. Since the impulse response extends for 5 symbol periods, each input sample contributes to 5 symbols. Accordingly, in each clock period of the sample clock 21 a digital sample value is provided to each of 5 multipliers 87, 89, 91, 93, 95, and each multiplier also receives a respective coefficient value from a respective coefficient store 97, 99, 101, 103, 105. The sample value is multiplied by each respective coefficient value in the respective multipliers 87, 89, 91, 95 and the respective products are output to the respective accumulators 77, 79, 81, 83, 85. Each coefficient store 97, 99, 101, 103, 105 stores coefficients representing a respective symbol period in the impulse response of the filter.

Figure 9:
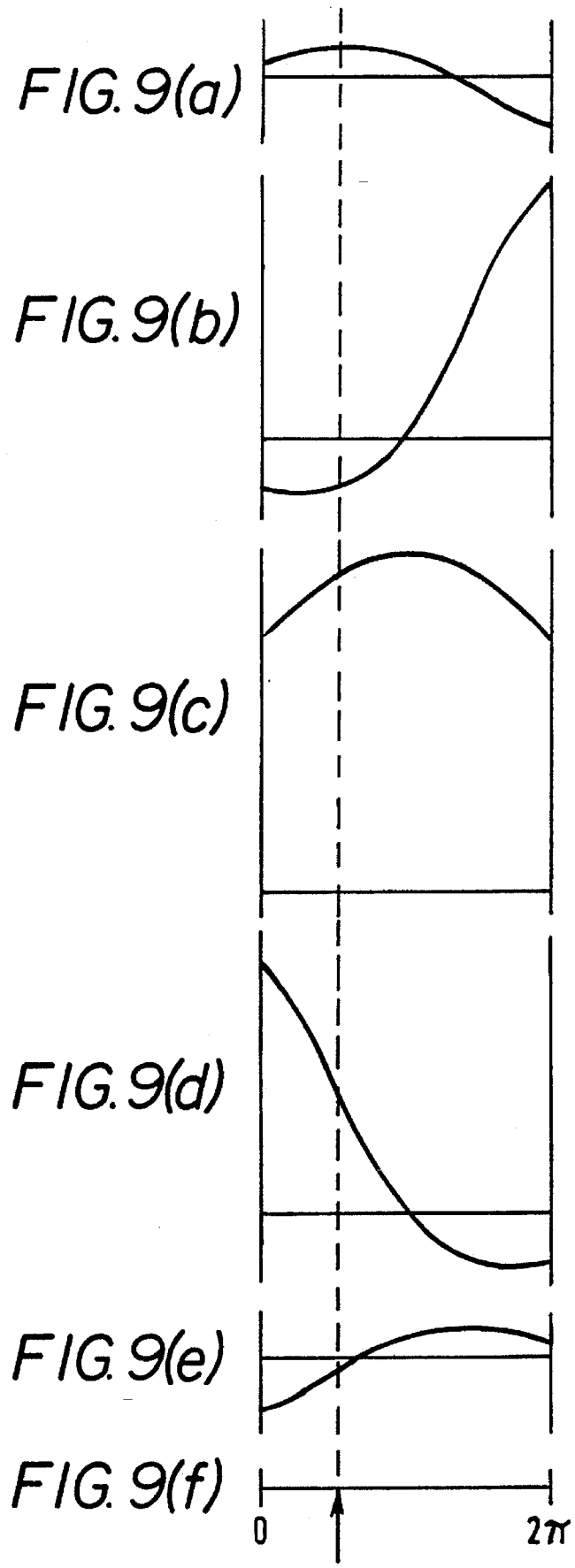
FIGS. 9A–9F illustrates the use of the output of the accumulator of FIG. 6 as a phase position marker to identify respective positions on the impulse response to FIG. 2.

FIG. 9(*a*) to FIG. 9(*e*) show the 5 impulse response portions represented by the coefficients stored in the 5 coefficient stores 97, 99, 101, 103, 105 with a common horizontal axis representing time or phase position within the symbol period. FIG. 9(*f*) represents the value output by the numerically controlled oscillator 67. As explained above with reference to FIG. 7, this value represents the current phase position in the symbol clock at each period of the sample clock. The arrow in FIG. 9(*f*) represents the current value output by the numerically controlled oscillator 67, and during each symbol period this will step from left to right across FIG. 9.

At each sample clock period, when a new sample value is input to the filter architecture of FIG. 8 and is to be multiplied by selected components, the current phase position represented by the output from the numerically controlled oscillator 67 and illustrated by the arrow in FIG. 9(*f*) can be read onto the 5 plots of respective symbol periods of the impulse response, as indicated by the dotted line in FIG. 9, to find the value of the 5 impulse response portions at that symbol phase. This value is the appropriate coefficient value to use in the respective 5 multipliers 87, 89, 91, 93, 95 of FIG. 8. The phase signal provided from the numerically controlled oscillator 67 to the data rate converting filter 23 is 6 bits wide, and accordingly it has 64 possible values. The filter impulse response has been sampled to provide 64 predetermined coefficient values per symbol period, and accordingly each coefficient store 97, 99, 101, 103, 105 stores an appropriate coefficient value for each possible digital phase value output from the numerically controlled oscillator 67.

Since the digital phase value output by the numerically controlled oscillator 67 is only accurate to 6 bits, it represents an approximation to the precise phase position of the sample clock in the symbol period. Accordingly the coefficient value output from a respective coefficient store 97, 99, 101. 103, 105 in response to a phase value will be a good approximation to the ideal coefficient value by which the sample value should be multiplied but will not necessarily be precisely the ideal coefficient value. If further accuracy is required, each coefficient store 97, 99, 101, 103, 105 could store a greater number of possible coefficient values and the phase signal output by the numerically controlled oscillator 67 could be more bits wide.

As noted above, the phase-locked loop containing the numerically controlled oscillator 67 is typically accurate to about 1 part in 16. That is to say, the loop is accurate to 4 bits. Accordingly, there is little benefit in this case in providing the output of the numerically controlled oscillator 67 to more than 6 bits. However, in other data rate converting circuits, in which the relative phase positions of the input and output clocks can be determined more accurately, there may be an advantage in using more bits in the digital phase signal output by the numerically controlled oscillator 67.

Returning to FIG. 8, successive input digital sample values are multiplied by appropriate coefficients while the phase signal from the numerically controlled oscillator 67 steps through one symbol period, until the numerically controlled oscillator 67 rolls over. At this point, each accumulator has accumulated a partial sum representing the contribution of one symbol period in the input signal to a respective symbol. In response to the "rollover detect" signal, the value of each accumulator 77, 79, 81, 83, 85 is output to an adding pipeline comprising alternating delay latches 107, 109, 111, 113 and adders 115, 117, 119, 121. Each adder 115, 117, 119, 121 receives a partial sum for a respective accumulator and adds it to the running total of partial sums from previous accumulators provided by one of the delay latches 107, 109, 111, 113 immediately upstream of the respective adder, and then outputs the updated sum. The output of the final adder 121 is a total of all component products for a symbol value, and is output from the data rate converting filter 23. The sum output by each of the other adders 115, 117, 119 is input to a following delay latch. The new values are stored in the delay latches 107, 109, 111, 113 and the accumulator 77, 79, 81, 83, 85 are reset. The accumulation of symbol values for another symbol period continues until the "rollover detect" signal is output again.

Accordingly, during one symbol period the first accumulator 77 accumulates values for one symbol using the input sample values and the first symbol period of the filter's impulse response. At rollover, the accumulated value for the first symbol period of the impulse response is output to the first delay latch 107. During the next symbol period, the second accumulator 79 accumulates values for the same symbol using input sample values and coefficient values for the second symbol period of the impulse response. At the next rollover, the accumulated first symbol period value from the first delay latch 107 is added to the accumulated second symbol period value from the second accumulator 79 in the first adder 115, and is stored in the second delay latch 109. During the third symbol period, values for the same symbol are accumulated in the third accumulator 81, and at the next rollover these are added by the second adder 117 to the value from the second delay latch 109. This sum is stored into the third delay latch 111, and the fourth and fifth symbol period contributions to the symbol value are accumulated and added into the symbol value in the same way. In this way, it can be seen that it takes 5 symbol periods for a symbol value to be developed, as the symbol moves successively through the pipeline of delay latches 107, 109, 111, 113 and adders 115, 117, 119, 121.

In the filter architecture illustrated in FIG. 8, the multipliers 87, 89, 91, 93, 95 and the coefficient stores 97, 99, 101, 103, 105 are shown separately. However, it is frequently convenient to implement this filter architecture with a different physical construction in which each respective pair of a coefficient store and a multiplier is implemented in a single respective look-up table in memory. This is indicated by the broken line, indicating a look-up table, around the fifth multiplier 95 and the fifth coefficient store 105. In this construction, the 6-bit phase position signal from the numerically controlled oscillator 67 and the input digital sample value are provided as address inputs to the look-up table. For each possible address input, the look-up table stores the product of the input digital data value and the coefficient value corresponding to the input phase value.

In the operation of the modem of FIG. 4, the phase sensitive detector 63 and the numerically controlled oscillator 67 can be locked to the output symbol period, for almost any symbol data rate. Accordingly, the modem can be used to demodulate the data with almost any data rate or baud rate, without needing to alter the frequency of the sample clock 21 which controls the ADC 19. The shape of the impulse response is defined in terms of the output data symbol period, and the coefficients to be used are reselected at each input data sample period. Accordingly, if the outpost data symbol rate changes, the bandwidth of the filter will change correspondingly, which is normally desirable. As can be seen from FIG. 8, this data rate conversion method and filter architecture can easily be implemented with dedicated high speed hardware. For example, the data rate converting filter 23 could be built as an ASIC (application-specific integrated circuit), or the accumulators 77, 79, 81, 83, 85 and the pipeline of delay latches 107, 109, 111, 113 and adders 115, 117, 119, 121 could be implemented in an FPGA with the multipliers 87, 89, 91, 93, 95 and the coefficient stores 97, 99, 101, 103, 105 being implemented by look-up tables in memory (e.g. ROM) as discussed above.

Although not shown in FIG. 4, conventional interpolating or decimating filters could be provided before or after the data rate converting filter 23. If such a filter is provided upstream of the data rate converting filter 23, the rate of the clock signal from the sample clock 19 should be altered by a corresponding factor before being input to the data rate converting filter 23 and the numerically controlled oscillator 67. If any such filter is provided downstream of the data rate converting filter 23, its effect on the symbol rate will need to be taken into account in designing the phase-locked loop controlled by the phase sensitive detector 63.

Additionally, data buffers may be provided at the input and/or the output side of the data rate converting filter 23. In this case, it may be desirable for the rollover cycle of the numerically controlled oscillator 67 to last for several symbol periods so that the digital phase signal includes an integer part as well as a fractional part. The "rollover detect" signal used to control operation of the data rate converting filter 23 would then be provided each time the integer value changed, and not only when the accumulator rolled over. The integer part of the digital phase value could be used for buffer control. For example, it could provide a write address for an output buffer.

In the embodiment just described, the impulse response of the filter is sampled at an integer multiple of the symbol frequency. In order to determine which coefficient to use, the phase relationship between the sample periods and symbol periods has to be determined for each input sample. However, this information will identify which coefficient to use with that input data sample in calculating its contribution to each symbol to which it contributes. Accordingly, all calculations using a given input sample can be carried out simultaneously, but it takes several cycles of operation of the data rate converting filter 23 to accumulate the final value of a symbol.

In the next embodiment, the family of coefficient values for the filter are obtained by sampling the impulse response at a multiple of the sample rate, rather than the symbol rate. This means that the bandwidth of the filter is determined by the sample clock 21 controlling the ADC 19 in the demodulator of FIG. 4, the bandwidth does not change with changes in the symbol rate, and the impulse response curve will not extend over exactly 5 symbol periods. These features are normally disadvantageous, and in this embodiment each family of coefficients is normally usable only with a restricted range of output data rates and different families of coefficient values must be used for different ranges of output data rates. However, this embodiment has some practical advantages.

When the phase relationship between the sample clock and the symbol clock is calculated, the phase information in this embodiment specifies which coefficient is required for every sample contributing to a given symbol. Accordingly, the calculations of the contribution of given sample to different symbols is calculated at different times, but the value of each output symbol is calculated in a single operation. This mode of operation requires an input buffer to hold each data sample until all symbols to which it contributes have been calculated, and the phase signal output by the numerically controlled oscillator 67 includes an integer part used to calculate the read address for the input buffer. The particular advantage of this embodiment is that it is easier to implement in software than the previous embodiment, and can be implemented using DSP processors such as the AT&T DSP 16 Series.

Figure 10:
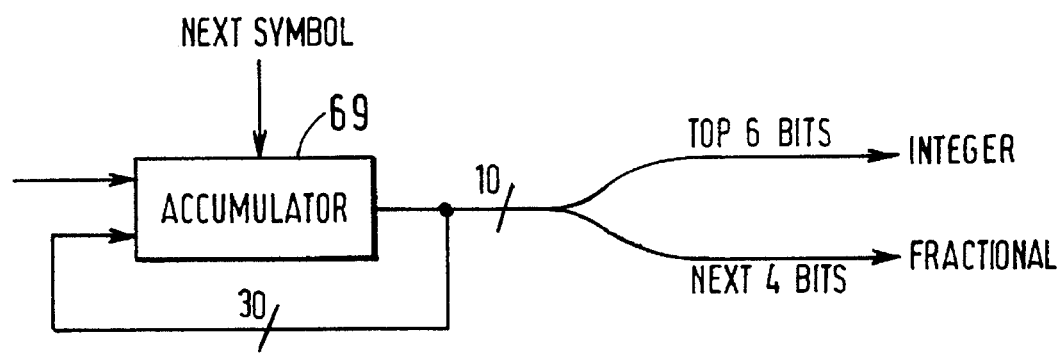
FIG. 10 illustrates a numerically controlled oscillator arranged for use with an alternative filter architecture.

FIG. 10 illustrates the accumulator 69 of the numerically controlled oscillator 67 in this embodiment. This has been designed to work in a circuit in which the input buffer for the data rate converting filter 23 is 64 data samples long, and each family of filter coefficients has been obtained by sampling an appropriate impulse response curve at 16 points in each input data sample period. As with the accumulator of FIG. 6, the total length of the phase number stored in the accumulator is 30 bits. However, the accumulator 69 in FIG. 10 is not clocked by the clock signal from the sample clock 21 but is clocked each time the data rate converter filter 23 processes another output data symbol. Accordingly, the digital phase value output by the accumulator 69 in FIG. 10 represents the phase position of the symbol under consideration with respect to the input data sample stream. The numerically controlled oscillator 67 is locked to the phase of the output data symbols in the same manner as is illustrated in FIG. 4. However, the controlling frequency number developed in the integrator 75, which controls the accumulator 69, is the number of sample periods per symbol period (and may be an integer plus a fractional part) in FIG. 10, whereas this number usually represents the fraction of a symbol period present in a sample period for the accumulator of FIG. 6.

The top 10 bits of the accumulator value are output in the circuit of FIG. 10. The top 6 bits represent the integer value of the phase number, and indicate which input data sample is the first data sample which contributes to the output data symbol under consideration. The integer part has 6 bits to match the 64-sample length of the input buffer. The next 4 bits of the accumulator provide the fractional phase output number. This represents the phase position of the present output data symbol with reference to the input data sample stream, and is used to select the coefficient values to be used with each input data sample. This fractional part is 4 bits wide because the data rate converting filter 23 has been set up with 16 coefficient values per input data sample period.

In this embodiment, there will not be exactly 64 coefficient values of the impulse response per output data symbol period. However approximately this number can be provided. For example, if there are 16 coefficients per input sample period and the sample rate is 3.9 times the symbol rate, there will be about 62.4 coefficients per symbol period.

Figure 11:
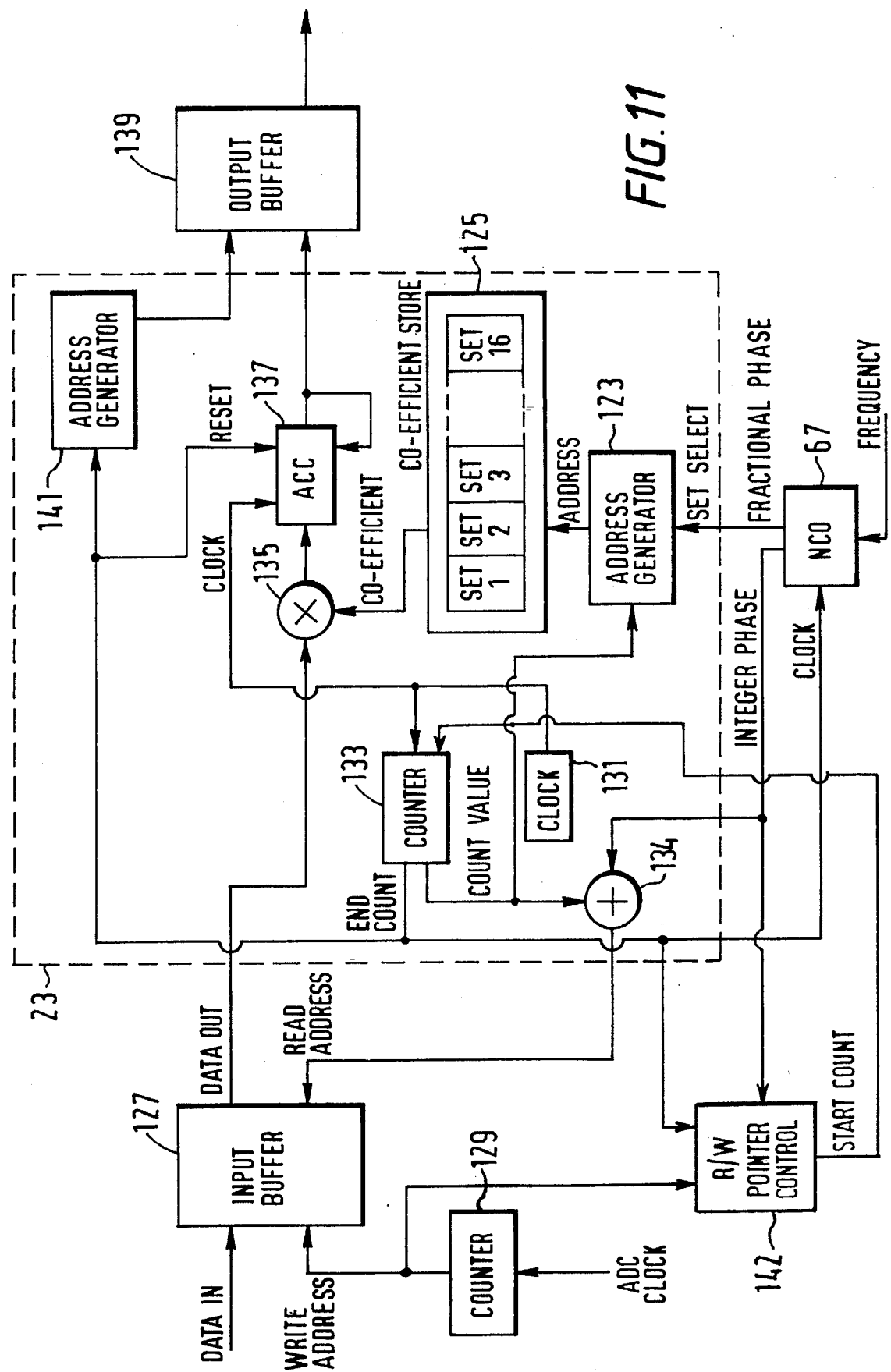
FIG. 11 illustrates a filter architecture using the accumulator of FIG. 10 and embodying the present invention.

FIG. 11 shows the filter architecture for the data rate converting filter 23 in this embodiment. In this embodiment, the family of coefficient values representing the impulse response of the filter are separated into 16 sets of values, each representing one of the 16 possible phase relationships between the impulse response and the input data sample timing. The central peak of the impulse response should be in phase with the output data sample being generated. Accordingly, the fractional phase part of the output of the numerically controlled oscillator 67 indicates which set of coefficient values should be used for generating a particular output data symbol. Therefore, it is input as a "set select" signal to an address generator 123 for the coefficient store 125.

The incoming data samples received from the first digital mixer 39 are written into an input buffer 127 at a write address generated from the sample clock by a 6-bit counter 129. The integer part of a digital phase value output by the numerically controlled oscillator 67 is provided to the data rate converting filter 23 as a start address for reading data from the input buffer 129 in an operation to calculate the value of an output data symbol.

The operation of the data rate converting filter 23 to generate an output data symbol is controlled by an internal clock 131. The internal clock 131 drives a counter 133. An adder 134 adds the output count value of the counter 133 to the initial address value provided by the integer part of the digital phase number from the numerically controlled oscillator 67, to generate successive read addresses for reading input data samples from the input buffer 127. In this way the read addresses provided to the input buffer 127 start from the address indicated by the integer part of the digital phase value. The count value is also provided to the address generator 123, so that it steps through the addresses in the coefficient store 125 for the set of coefficient values selected in accordance with the fractional part of the digital phase value output by the numerically controlled oscillator 67. Accordingly, each input data sample is read from the input buffer 127 and provided to a multiplier 135 simultaneously with a corresponding coefficient value read from the coefficient store 125. The product is accumulated in an accumulator 137 under the control of the internal clock 131.

When the internal counter 133 reaches the value indicating that all input data samples contributing to an output data symbol have been read, it provides an "end count" signal, which indicates that the value now accumulated in the accumulator 137 is the value of the current output data symbol. Accordingly, the value in the accumulator 137 is stored in an output buffer 139 at an address provided by an address generator 141, and the address of the output buffer 139 is incremented to be ready for the next output data symbol value. The "end count" signal is also provided as a clock input to the numerically controlled oscillator 67, so that it updates its accumulated value by the frequency number, and provides the digital phase value for the next symbol to be generated. The system is now ready to generate the next symbol.

The relative positions of the write address and the read address for the input buffer 127 is monitored by a read/write pointer control unit 142, and the frequency with which the data rate converting filter 23 generates new symbol values is controlled to prevent these address values from crossing over, representing underflow or overflow of the input buffer 127.

The read/write pointer control unit 142 receives the write address value for the input buffer 127 from the counter 129, and receives the integer part of the digital phase value from the numerically controlled oscillator 67, which represents the start address for reading from the input buffer 127. The pointer control unit 142 ensures that the write address from the counter 129 is sufficiently far ahead of the start address for reading, as represented by the integer part of the digital phase value, to keep the read address value below the write address value for all permitted count values of the counter 133. The pointer control unit 142 receives the "end count" signal from the counter 133, and controls the counter 133 through a "start count" signal which is applied to a reset input of the counter 133. The counter 133 is constructed so that after it reaches its "end count" value, it stops counting until it is reset by the "start count" signal. The pointer control unit 142 monitors the write address value from the counter 129 and the integer part of the digital phase value from the numerically controlled oscillator 67, and provided that these are sufficiently far apart it responds to the "end count" signal from the counter 133 by outputting the "start count" signal to reset the counter 133 and begin the calculation of the next output data symbol value. If the address values have got too close to each other, the pointer control unit 142 delays providing the "start count" signal until the write address for the input buffer 127 has moved away sufficiently far ahead of the integer part of the digital phase value.

In the description of FIG. 11 it has been assumed that the integer part of the digital phase value represents the lowest read address used in generating an output data symbol value, and successive read addresses are generated by adding the count value from the counter 133. As an alternative, the integer part of the digital phase value can be used as the highest read address, and the adder 134 may be configured to subtract the count value of counter 133. This simplifies the operation of the pointer control unit 142, since it need only ensure that the start address value represented by the integer part of the digital phase value is below the write address, without needing to take into account the maximum possible count value output by the counter 133. Of course, it is necessary to ensure that the address generator 123 and the coefficient store 125 are set up to output the coefficients in the correct order to match the order in which data is read out from the input buffer 127.

Data may be read from the output buffer 139 in accordance with requirements of downstream circuitry, and monitoring may be performed to avoid underflow or overflow of this buffer also.

In FIG. 11, the coefficient store 125 is illustrated as containing only one family of coefficient values representing the impulse response of the filter 23. As explained above, this family of coefficient values will only be suitable for use with a limited range of output data symbol frequencies, and accordingly different families of values will be needed for different ranges of output data rate.

The filter architecture of FIG. 11 fits into the demodulating modem architecture of FIG. 4 in substantially the same way as the filter architecture of FIG. 8.

Figure 12:
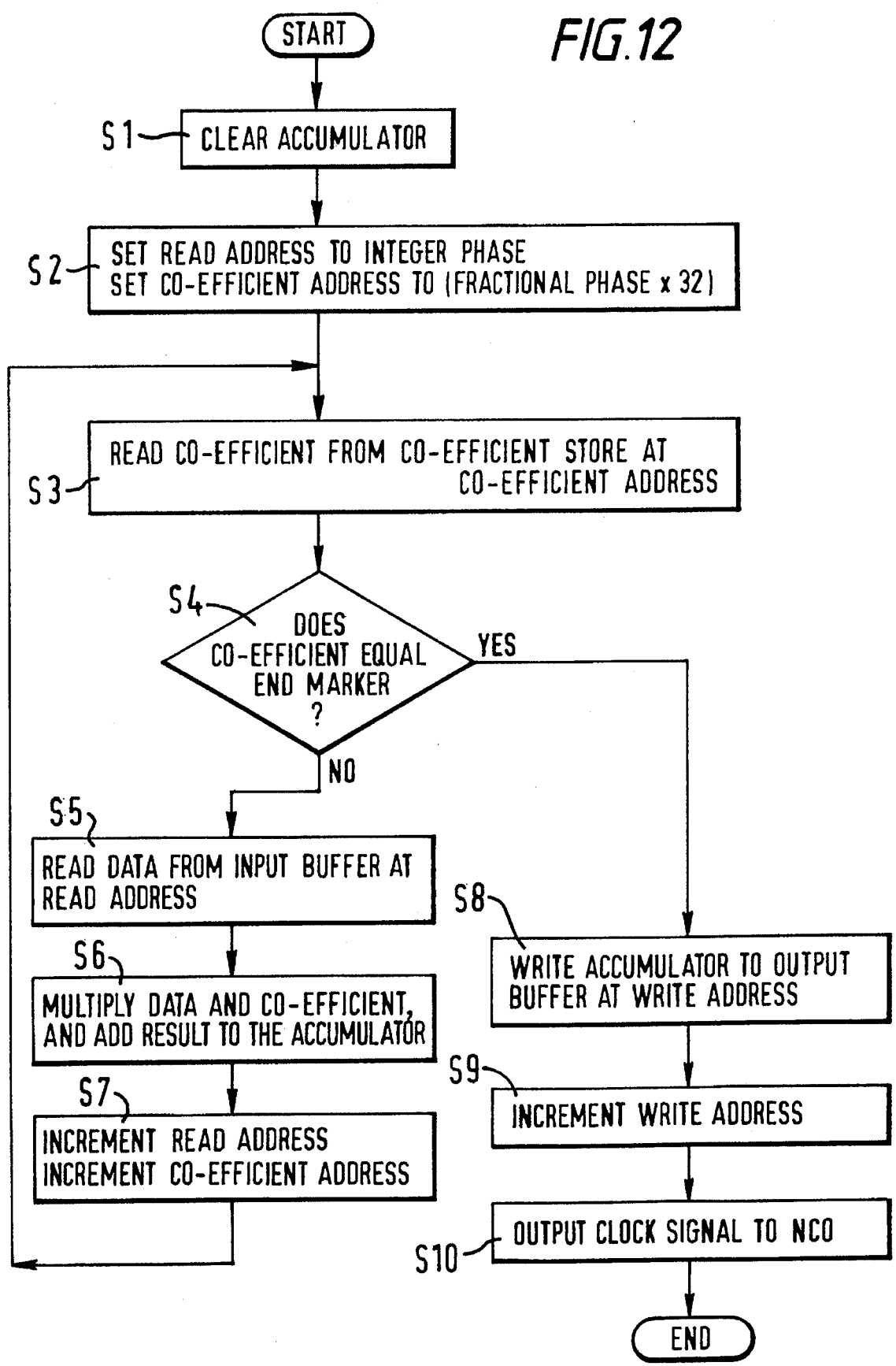
FIG. 12 is a flow diagram illustrating a software implementation of the filter architecture of FIG. 11.

Although FIG. 11 illustrates the architecture of the data rate converting filter 23 with reference to notional hardware components, this architecture is suitable for implementing in software. FIG. 12 is a flow diagram of a software routine for generating an output data symbol value. The software routine of FIG. 12 implements the architecture of the portion of Fig, 11 enclosed by the broken line.

Following start of the operation to obtain the value of an output data symbol, the current value of the accumulator is cleared in step S1. Then, the integer portion of the digital phase value from the numerically controlled oscillator 67 is stored as the initial value for the read address for the input buffer 127, in step S2. Also, in step S2 the fractional part of the digital phase number is used to set the initial value of the coefficient address. In this routine, it is assumed that there will not be more than 31 coefficient values in the set of values to be used to generate any output data symbol, that the values of any given set are stored at successive addresses in the coefficient store (which may be a designated part of the general memory of the processor), and the coefficient values for successive sets start at address values different by 32. In this embodiment, it is permitted for different sets of coefficients in a given family to contain a different number of coefficients. This would arise, for example, if the ends of the impulse response waveform were not an integer multiple of input data sample periods apart, in order to set the length of the impulse response waveform close to 5 output data symbol periods. This can be accommodated by providing an end marker value in the coefficient store at the address immediately after the final valid coefficient value of each set. The end marker value could be a coefficient value which will never occur in practice, such as the maximum possible coefficient value which can be stored. In accordance with this anticipated configuration of the coefficient store, the fractional part of the digital phase value is multiplied by 32 in step S2, and the result is set as the initial coefficient address.

Following these initialisation steps, the accumulation of values contributing to the output symbol data value can begin. First, in step S3 the required coefficient value is read from the coefficient store at the coefficient address. In step S4, the value of the coefficient is checked to determine whether it is the end marker indicating that all valid coefficient values have been used. Provided that the coefficient value does not represent the end marker, the routine continues to step S5 in which the required input data value is read from the input buffer 127 at the read address.

In step S6 the data value read from the input buffer and the coefficient value read from the coefficient store are multiplied, and the result is added to the accumulator. Then the read address and the coefficient address are both incremented in step S7, and the routine returns to step S3 to read the next coefficient value.

The routine will repeat steps S3 to S7, multiplying successive input data values by the corresponding coefficient values and adding the results to the accumulator, until it is determined in step S4 that the coefficient value read from the coefficient store is the end marker, indicating that all input values contributing to the current output value have been read. At this point, the value in the accumulator represents the desired output data symbol value, and the routine passes to step S8, at which the value in the accumulator is written to the output buffer at the current write address.

The routine is completed by incrementing the write address in step S9 and outputting a clock signal to the numerically controlled oscillator 67 in step S10, to provide an updated digital phase value in preparation for the next output data calculation routine.

Steps S9 and S10 can be carried out at the end of the routine as shown in FIG. 12, or can be carried out with steps S1 and S2 as part of the initialisation part of the routine. Steps S1 and S2 are preferably carried out at the beginning of the routine and not at the end, to ensure that the accumulator is properly cleared and the read address and coefficient address are properly set, in case these values have been altered to incorrect values since the routine was last carried out.

In the routine of FIG. 12, the operation of testing for the end marker in step S4 may place an undue processing burden on the system, which is disadvantageous since the loop from step S3 to step S7 must be executed very quickly. Accordingly, it may be preferable to ensure that each set of coefficients in the coefficient store contains a predetermined known number of coefficients, so that a loop made up of steps S3, S5, S6 and S7 is executed the preset number of times and then the procedure passes automatically to step S8. With some processor architectures and instruction sets, it provides less burden on the processor to execute a loop a preset number of times than to control the loop by testing for a predetermined value as in step S4.

If this filter architecture is implemented using an AT&T DSP 16 series processor, the routine will be slightly different. This processor can be set up to step through the coefficient store at fixed integer intervals, with a variable offset. Accordingly, the coefficients are not separated into sets in the coefficient store but are stored as a single impulse response. The processor is programmed to step through the store at an interval of 16 coefficients from an initial offset value set by the fractional part of the digital phase value.

Figure 13:
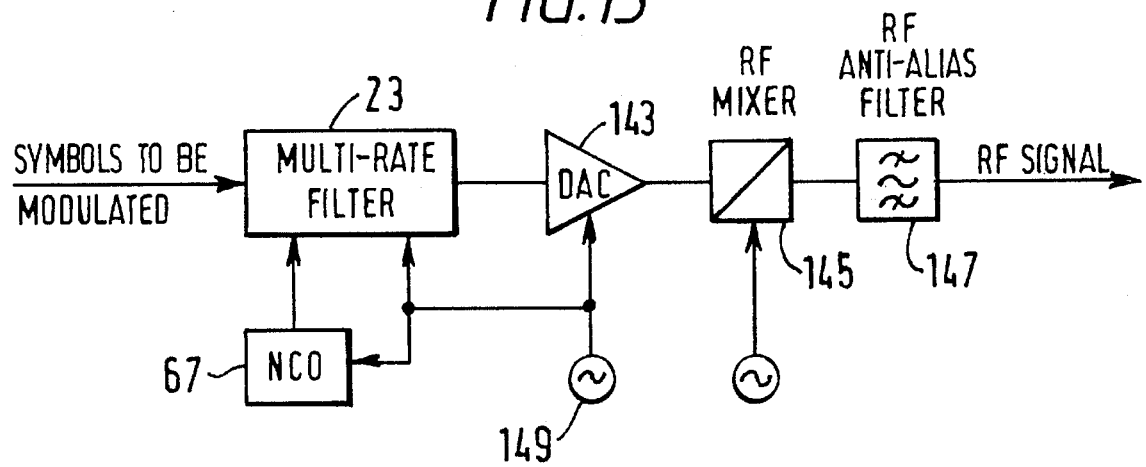
FIG. 13 is a schematic overview of the architecture of a modulating modem.

The overall architecture of a modulating modem is shown in FIG. 13. The basic architecture comprises the data rate converting filter 23, a digital-to-analog converter 143, a radio frequency mixer 145, and a radio frequency anti-aliassing filter 147. Automatic gain control circuits and further mixers can be provided, in a manner similar to that shown in FIG. 4, as desired. In general, modulator circuits tend to be simpler than demodulator circuits. In a manner corresponding to the demodulator of FIG. 4, the DAC 143 in FIG. 13 is driven by a sample clock 149 which provides a clock signal at a suitable arbitrary fixed frequency, e.g. 40 MHz. The data rate converting filter 23 is arranged to provide output data samples at this rate, regardless of the data rate of the incoming data symbols to be modulated.

Figure 14:
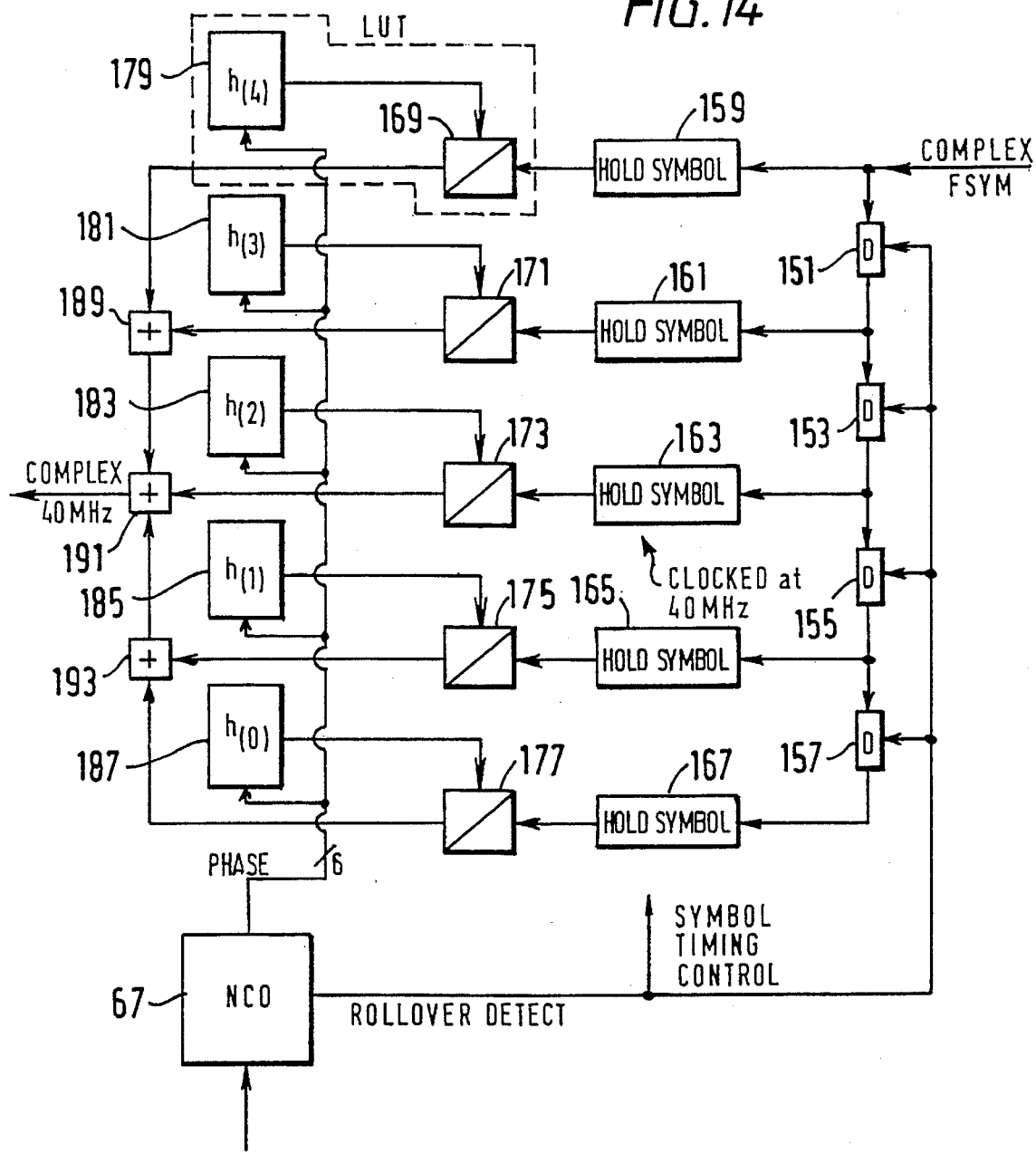
FIG. 14 illustrates a data rate converting filter architecture, corresponding to the architecture of FIG. 8, embodying the present invention and for use in the modulating modem architecture of FIG. 13.
Figure 14A:
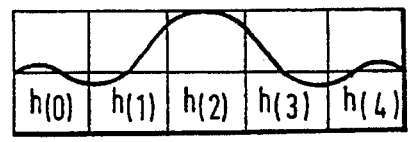

FIG. 14 shows an architecture for the data rate converting filter 23 to be used in the modulating circuit of FIG. 13. The filter architecture of FIG. 14 is arranged to be substantially the inverse of the demodulator filter architecture of FIG. 8, and the filter architecture of FIG. 14 is for use with filter coefficient values which represent samples of the impulse response taken at a frequency which is a multiple of the input data symbol rate. The impulse response is arranged to be 5 input data symbol periods long. Accordingly, each output data sample to be provided to the DAC 143 is obtained by multiplying 5 input data symbol values by respective coefficients.

In the architecture of FIG. 14, the numerically controlled oscillator 67 is as shown in FIG. 6. It is clocked in accordance with the signal from the sample clock 149 of DAC 143, and outputs a digital phase number representing the phase of the current output data sample with respect to the period of the input data symbols. The filter architecture of FIG. 14 is arranged to take in a fresh received data symbol in response to the "rollover detect" output from the numerically controlled oscillator 67. If desired, the "rollover detect" signal and a clock provided at the input data symbol rate can be provided to a phase comparator, for outputting an error signal to control the numerically controlled oscillator 67 as part of a phase-locked loop. This will keep the "rollover detect" signals, which cause the filter to take in the next input data symbol, to be provided in phase with the incoming data symbols. Alternatively, the incoming data symbols may be stored in an input buffer, and read from the buffer in response to the "rollover detect" signal. In this case, the "rollover detect" signal does not need to be precisely synchronised to the input data symbol stream, although it may be necessary to provide a system for monitoring and controlling the read and write addresses of the input buffer to avoid overflow or underflow.

The filter architecture of FIG. 14 comprises a pipeline of 4 delay latches 151, 153, 155, 157 and 5 symbol holding stores 159, 161, 163, 165, 167, all of which are clocked to receive data in response to the "rollover detect" signal. When a fresh input data symbol value is received, it is stored in the first holding store 159 and in the first delay latch 151. After another "rollover detect" signal, this data symbol value is read from the first delay latch 151 to the second holding store 161 and a second delay latch 153, while the next input data symbol value is read into the first holding store 159 and the first delay latch 151. In this manner, each input data symbol value moves through the pipeline of delay latches 151, 153, 155, 157, and appears in each holding store 159, 161, 163, 165, 167 in turn, synchronously with the "rollover detect" signal.

Data sample values are generated and output from the filter architecture of FIG. 14 synchronously with the clock signal for the DAC 143 provided from the sample clock 149. In each sample clock period, the current value of the input data symbol in each holding store 159, 161, 163, 165, 167 is multiplied by a respective coefficient value in a respective multiplier 169, 171, 173, 175, 177. The coefficient values are read from respective coefficient stores 179, 181, 183, 185, 187 in accordance with the digital phase signal from the numerically controlled oscillator 67.

The output value from each multiplier 169, 171, 173, 175, 177 represents the respective contribution to the current output sample of each of the 5 input symbol values which contribute to it. Accordingly, these contributions are added together in adders 189, 191, 193 and the resulting sum is output as the current data sample value.

Similarly to the architecture of FIG. 8, the filter architecture of FIG. 14 is suitable for implementing in high speed dedicated hardware. As described with reference to FIG. 8, each respective pair of a multiplier 169, 171, 173, 175, 177 and a coefficient store 179, 181, 183, 185, 187 may be implemented as a look-up table, receiving as address inputs the digital phase value from the numerically controlled oscillator 67 and the symbol data value from the respective holding store 159, 161, 163, 165, 167. The contents of the look-up table is arranged to output the product of the input data symbol value and the coefficient value specified by the digital phase value.

As with the architecture of FIG. 8, each coefficient store 179, 181, 183, 185, 187 stores coefficient values for a respective one of the 5 symbol periods of the impulse response of the filter.

Figure 15:
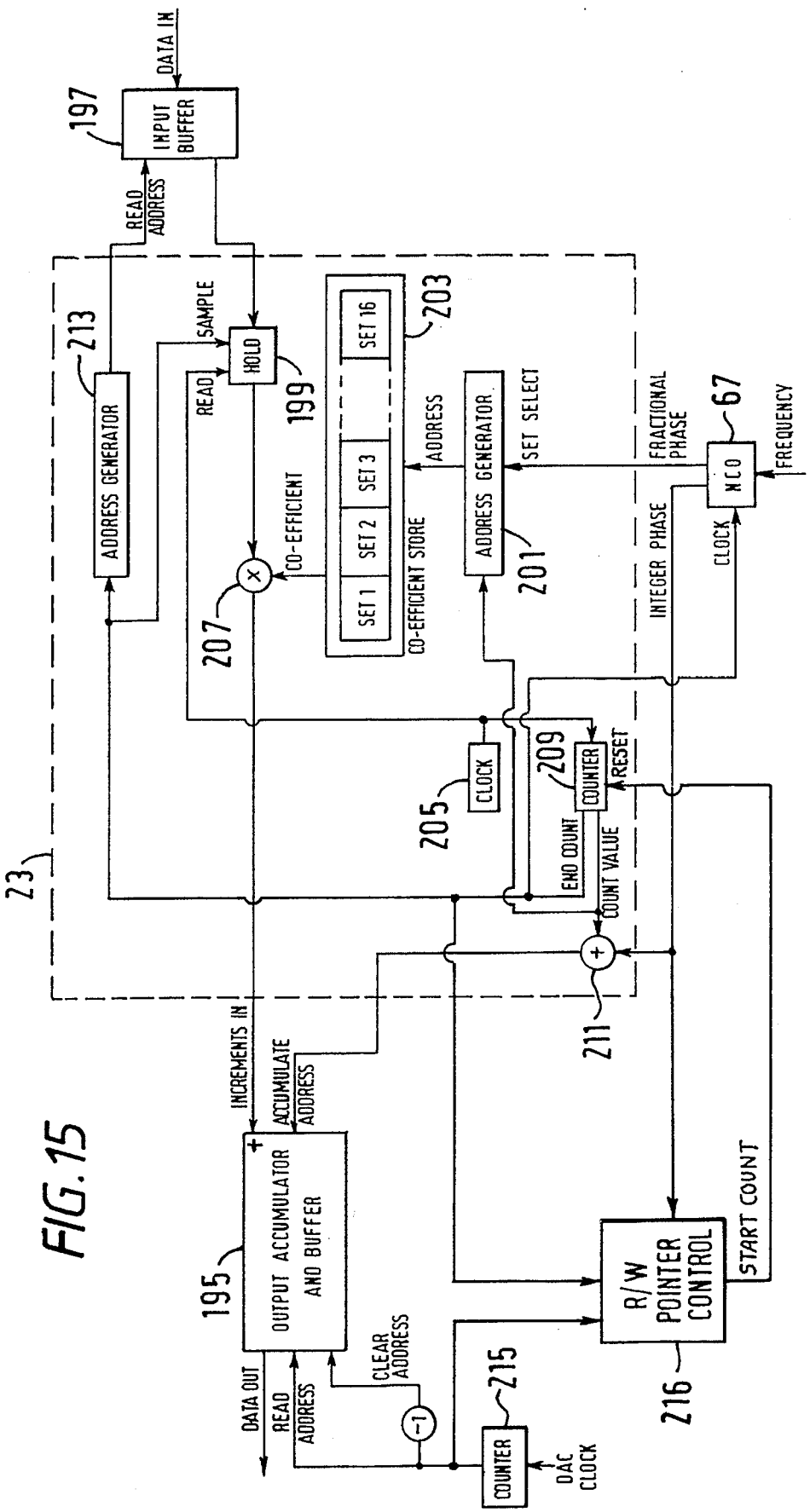
FIG. 15 illustrates an alternative modulating filter architecture embodying the present invention.

FIG. 15 illustrates an alternative architecture for the data rate converting filter 23 for use in a modulating modem. The architecture of FIG. 15 is substantially the inverse of the filter architecture of FIG. 11, and is intended for use with families of coefficients which represent the value of the impulse response of the filter sampled at a multiple of clock rate of the sample clock 149 for the DAC 143. Similarly to FIG. 11, the architecture of FIG. 15 assumes that there are 16 coefficient values per output data sample period.

The numerically controlled oscillator 67 in FIG. 15 operates as described with reference to FIG. 10, and provides digital phase values having an integer part and a fractional part representing the phase position of an input data symbol relative to the output data sample periods.

In FIG. 15 the fractional phase information from the numerically controlled oscillator specifies, in respect of one input data symbol value, the coefficients with which the symbol value should be multiplied to obtain the contributions of that symbol to each output data sample to which the symbol in question contributes. The integer part of the digital phase value from the numerically controlled oscillator 67 will indicate which output data samples the input data symbol contributes to, and it can be used to provide an address offset for an addressable output accumulator and buffer 195.

The input data symbol is stored in an input buffer 197. Each data symbol value is read in turn from the buffer 197 and held in a holding store 199. With the input symbol data value held in the holding store 199, an address generator 201 uses the fractional phase value to select which set of coefficient values to read from the coefficient store 203, and reads out each coefficient of the selected set in turn. At the same time, the symbol data value in the holding store 199 is repeatedly read out under the control of a clock 205, and the symbol data value is multiplied by each coefficient value in turn in a multiplier 207.

Each output of the multiplier 207 represents a contribution to the total value of an output data sample, different products from the multiplier 207 being contributions to different output data samples. Accordingly, each output from the multiplier 207 is added as an incremental value to the value already stored for the respective data sample in the addressable output accumulator add buffer 195. The address in the output accumulator and buffer of the first output data sample to which the current input data symbol contributes is identified by the integer part of the digital phase value output by the numerically controlled oscillator 67. A counter 209 counts under the control of the clock 205 and its output count value is added to the integer part of the phase value in an adder 211 to provide the address in the output accumulator and buffer 195 at which each increment value output by the multiplier 207 should be accumulated. The count value of the counter 209 is also input to the address generator 201 for the coefficient store 203, to step At through the coefficient addresses for the selected set.

When the counter 209 reaches a value indicating that the contribution from the current input data symbol for each output data sample has been output from the multiplier 207 and accumulated in the output accumulator and buffer 195, it outputs an "end count" signal which causes an address generator 213 to increment the read address for the input buffer 197, and the next input data symbol value is read from the input buffer 197. This new data symbol value is written into the holding store 199 in accordance with a "sample"

signal, which is also provided by the "end count" output from the counter 209. The "end count" output from the counter 209 is also input as a clock to the numerically controlled oscillator 67, so as to update the digital phase value in accordance with the fact that a fresh input data symbol has been stored in the holding store 199.

Output data samples are read from the output accumulator and buffer 195 in accordance with read addresses generated by a counter 215 from the clock signal from the sample clock 149. After an output data sample value has been read from the output accumulator and buffer 195, the corresponding address is cleared so that a further data sample value can be generated by accumulating increments at that address.

A read/write pointer control unit 216 is provided for the output accumulator and buffer 195. This is connected and operates in the same way as the read/write pointer control unit 142 of FIG. 11. It monitors the read address from the counter 215 and the start address for incrementing represented by the integer part of the digital phase value, and only resets the counter 209 if the read address is sufficiently ahead of the start address for incrementing the values in the output accumulator and buffer 195. As with FIG. 11, the adder 211 may be arranged to subtract the count value from the counter 209 from the integer part of the digital phase value so that the address for incrementing the buffer 195 counts downwards from the start value instead of counting upwards.

As with the filter architecture of FIG. 11, the filter architecture of FIG. 15 is suitable for implementing in software.

Figure 16:
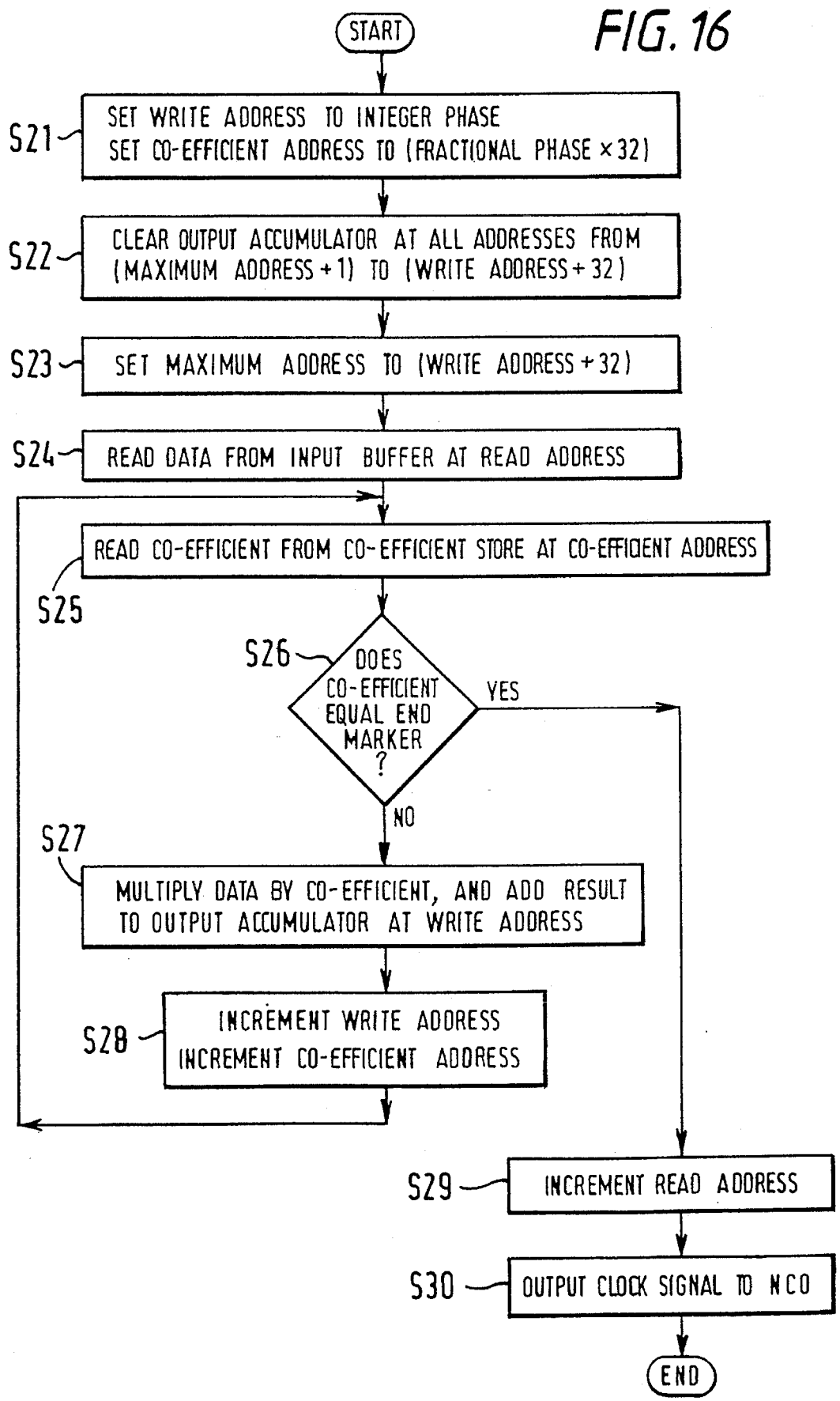
FIG. 16 is a flow diagram illustrating the software implementation of the filter architecture of FIG. 17.

FIG. 16 is a flow diagram of a software implementation of the major functions of the filter architecture of FIG. 15, and is generally analogous to the flow diagram of FIG. 12. As in FIG. 12, it is assumed in FIG. 15 that each set of coefficient values cannot contain more than 31 coefficient values, that each set of coefficient values is stored in a successive part of the coefficient memory with each successive start address greater than the previous start address by 32, and the last valid coefficient value in each set is immediately followed by an end marker.

Following starting of the software routine of FIG. 16, the integer part of the digital phase value from the numerically controlled oscillator 67 is stored as the current write address, and the fractional part of the digital phase value is multiplied by 32 and the product is stored as the current value of the coefficient address, in step 821.

Since it is assumed that there are no more than 31 valid coefficient values in a set of coefficient values, it follows that each input data symbol value cannot contribute to more than 31 output data sample values. Accordingly, the software routine maintains a maximum address value which is 32 greater than the initial write address value specified by the integer part of the digital phase value, and all output data sample values to which the current input data symbol value contributes will appear in the output accumulator at addresses in the range from the write address value to the maximum address value.

Since the output data sample values are obtained by accumulating increments at accumulator address locations, it is important to ensure that each accumulator address location is cleared (set to zero) before the first increment is added into that address location. Accordingly, when the maximum address is updated to correspond with a new integer part of the digital phase value, all output accumulator addresses between the old maximum address and the new maximum address must be cleared. Therefore, in step S22 the output accumulator is cleared at all addressee from the address immediately following the current maximum address value up to the address 32 greater than the newly-set write address value. Then in step S23 the maximum value is updated to be 32 greater than the write address value. Steps S22 and S23 "clear the way" for new output data sample values to be accumulated.

The initialisation part of the routine is completed in step S24 by reading the symbol data value from the current read address of the input buffer.

In step S25 a coefficient value is read from the coefficient store at the current coefficient address, and in step S26 it is checked whether the coefficient value which has just been read is the end marker. Provided that the coefficient value is not the end marker, the current data value (read from the input buffer in step S24) is multiplied by the coefficient value in step S27, and the result is added to the value already present in the output accumulator at the current write address.

Next, the write address for the output accumulator and the coefficient address are each incremented in step S28, and the procedure returns to step S25 to read the next coefficient value.

Steps S25 to S28 are repeated, with the current symbol data being multiplied by successive coefficients and the result added to successive addresses in the output accumulator, until the coefficient end marker is detected in step S26. This indicates that all contributions of the current input data symbol value to output data-sample values have been calculated and added to the relevant addresses of the output accumulator, and processing of this input data symbol value is completed. The procedure accordingly passes to step S29, in which the read address for the input buffer is incremented ready to read the next input data symbol value next time the routine of FIG. 16 is carried out. Then in step S30 an output clock signal is provided to the numerically controlled oscillator 67 to update the digital phase value ready for the next time that the routine is carried out, and then the routine ends.

As with the routine of FIG. 12, step S26 in FIG. 16 may be replaced by performing the loop of steps S25, S27 and S28 a preset number of times to relieve pressure on the processor, provided that each set of coefficient values contains a known preset number of coefficients. Additionally, in the routine of FIG. 16 the accumulator addresses are cleared immediately ahead of the operation of writing into the accumulator, by steps S22 and S23 in the routine. In practice, it may be more convenient to arrange for the addresses in the accumulator to be cleared immediately after the respective address has been read to the downstream circuitry and applied to the DAC 143. It is necessary to ensure that each accumulator address is cleared after it is read and before the beginning of the next accumulation at that address, but the manner of providing a routine to implement this is a matter of choice taking into account the nature of the processor being used.

In the above discussion, attention has been drawn to the manner in which the filter architecture of FIG. 14 resembles the filter architecture of FIG. 8 and the manner in which the filter architecture of FIG. 15 resembles the filter architecture of FIG. 11. However, in one respect the filter architecture of FIG. 14 resembles the filter architecture of FIG. 11 and the filter architecture of FIG. 15 resembles the filter architecture of FIG. 8.

In the filter architecture of FIGS. 8 and 15 the pre-selected coefficient values represent the value of the impulse response waveform at instants sampled at a multiple of the output data rate of the filter, and in each operation cycle of the filter a single input value is taken and the contribution of that input value to each of several output values is calculated. In the architectures of FIGS. 11 and 14 the preselected coefficient values represent the value of the impulse response waveform sampled at a multiple of the input data rate, and in each filter operation cycle a plurality of input data values are taken and multiplied by respective coefficients to generate one output data value. In FIGS. 8 and 15, the filter performs one basic operation cycle per input data period and in FIGS. 11 and 14, the filter performs one basic operation cycle per output data period.

FIG. 11 has been described on the assumption that the input data rate (the data sample rate from the ADC 19) is greater than the output data rate (the data rate of demodulated data symbols). The filter architecture of FIG. 15 has been described on the basis of the input data rate (rate of data symbols to be modulated) is less than the output data rate (the clock rate of the DAC 143). However, the filter architecture of FIG. 11 can be operated with an output data rate which is greater than the input data rate and the filter architecture of FIG. 15 can be operated with an input data rate which is greater than the output data rate. Under these circumstances, the integer part of the phase value output from the numerically controlled oscillator 67 will not increment for every operation cycle of the filter, just as rollover does not occur in every cycle of the filter in the architectures of FIG. 8 and FIG. 14. The integer part of the digital phase value will continue to ensure that the correct read addresses are used with the input buffer 127 in FIG. 11 and the output accumulator and buffer 195 in FIG. 15.

In a similar manner, a filter architecture similar to that of FIG. 8 can be used with an output data rate greater than the input data rate and a filter architecture similar to that of FIG. 14 can be used with an input data rate greater than the output data rate, although some modifications are necessary with respect to rollover of the numerically controlled oscillator 67. First, with these data rates the numerically controlled oscillator 67 may rollover more than once in response to a clock input, because the digital frequency value being added to the accumulator will represent a phase change of greater than 2π. Therefore the numerically controlled oscillator 67 needs to be modified in some way, such as providing an integer part of the digital phase value, so as to indicate how many times rollover has occurred following clocking. Next, the signal which clocks the delay latches 107, 109, 111, 113 and resets the accumulators 77, 79, 81, 83, 85 in FIG. 8 and the signal which clocks the delay latches 151, 153, 155, 157 and clocks the read operation of the holding stores 159, 161, 163, 165, 167 in FIG. 14 would have to be generated from the output of the numerically controlled oscillator 67 using some additional logic so as to provide the same number of clock signals as the number of times that rollover has occurred. Additionally, the timing of each coefficient value in the impulse response waveform in FIGS. 8 and 14 is defined with reference to the phase of the data stream which was assumed to be slower in the description of these Figures. If this becomes the faster data stream, it may be desirable to change the impulse response so as to last for more than 5 periods of this data stream. This would require a corresponding increase in the number of parallel processing lines in these filter architectures.

Figure 17:
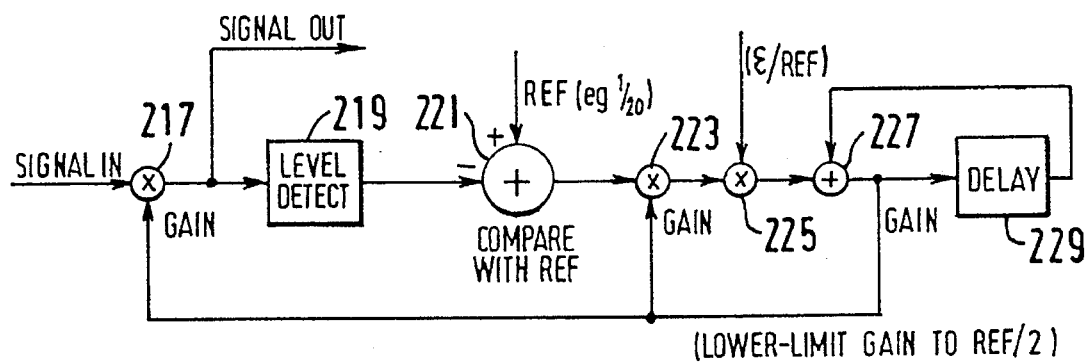
FIG. 17 shows an automatic gain control circuit embodying the present invention.

FIG. 17 illustrates an automatic gain control circuit in which the level error signal is multiplied by the gain value so as to tend to reduce the degree to which the time constant of the AGC circuit varies with the level of gain. This is useful in implementing the digital AGC 43 of FIG. 4, and FIG. 17 is drawn as a digital AGC circuit. However, the same modification could be applied to an analog AGC circuit such as the radio frequency AGC 25 in FIG. 4.

In FIG. 17 an input signal is multiplied by a gain value in a multiplier 217 to obtain an output signal. The level of the output signal is detected by a level detector 219. The detected level of the output signal is compared with a reference value to obtain an error signal, by subtracting the detected level from the reference level in an adder 221. The error signal is multiplied by the current level of gain in a gain multiplier 223 and is scaled by a constant scaling factor in a scaling multiplier 225. The result is added to the existing gain level in an adder 227 to obtain a new gain level, which is output to the signal multiplier 217, and the new gain level is fed back to the adder 227 through a delay 229. The delay 229 and the adder 227 act as an accumulator or integrator to continually vary the level of the gain by repeatedly adding in the value from the scaling multiplier 225.

If the effect of the gain multiplier 223 is ignored, and it is assumed that the error signal from the adder 221 is input directly to the scaling multiplier 225, then a change in the level of the output signal from the signal multiplier 217 will result in an initial change to the gain which will be proportional to the change in the level. If the change in the level of the signal output from the signal multiplier 217 was the result of a small change in a high level input signal subjected to low gain, a small change in that low gain will create a large change in the output signal level, so that the level of the output signal rapidly returns to the reference level. However, if the change in the level of a signal output from the signal multiplier 217 is the result of a large change in a low level signal subjected to high gain, the effect of the initial change in gain will be small, and the level of the output signal will not return to the reference level so quickly.

In general, a given change in the level of the output signal will create a given initial change in the level of the gain, which is then multiplied with the signal in the multiplier 217. Accordingly, the consequent change in the level of the output signal is proportional to the level of the input signal, and therefore is inversely proportional to the level of the gain (since the input signal times the gain provides the output signal level, which is controlled to be the reference level).

From the preceding analysis, it can be seen that the AGC circuit corrects the change in the level of the output signal more slowly when the gain is high than when the gain is low. In order to counteract this effect, the circuit of FIG. 17 modifies the error signal output by the adder 221 so as to reflect the level of the gain. It has been found in practice that multiplying the level of the error signal by the value of the gain is a suitable way of modifying the error signal. It would not be suitable to add the level of the gain to the error signal, since this would cause the gain integrator (adder 227 and delay 229) to continue to increase the gain level even if the error signal from the adder 221 was zero.

In the circuit of FIG. 15, with the error signal multiplied by the gain in gain multiplier 223, the change in the error signal output by the adder 221 following one cycle of the AGC loop will be approximately the previous value of the error multiplied by the reference level multiplied by the scaling constant input to scaling multiplier 225. Accordingly, the scaling multiplier 225 can be used to control the time constant of the AGC circuit. Preferably, the output gain of the AGC circuit is controlled so that it does not fall below a lower limit of about half of the reference level input to the adder 221.

Figure 18:
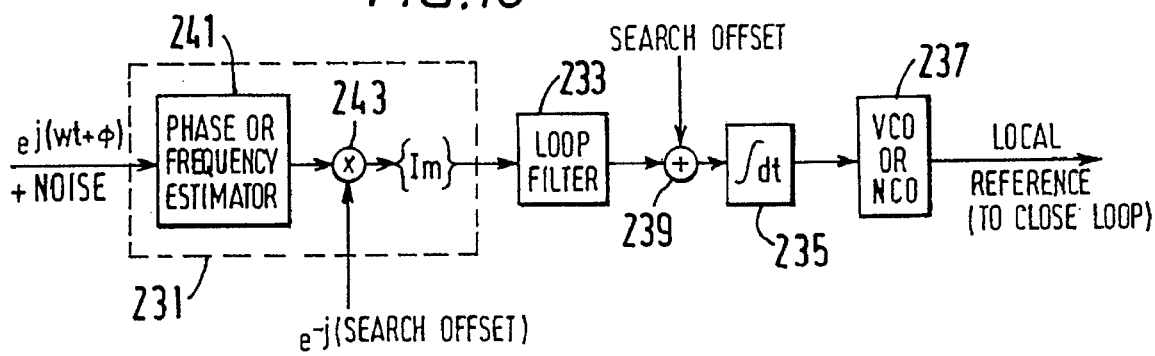
FIG. 18 shows an arrangement for compensating for the effects of a search offset in a phase-locked loop or a frequency-locked loop.

FIG. 18 illustrates a modification to part of a phase or frequency controlled loop, such as the loops controlling the voltage controlled oscillator 49, the numerically controlled oscillator 55, the numerically controlled oscillator 61 and the numerically controlled oscillator 67 in FIG. 4.

In FIG. 18 a phase or frequency sensitive detector receives an input signal, and outputs a phase or frequency error signal. This is passed through a loop filter 233 and is integrated in an integrator 235. The output of the integrator is a voltage (for an analog loop) or a number (for a digital loop) which sets the frequency of oscillation of the voltage controlled oscillator or numerically controlled 237 of the loop. As long as the error signal received by the integrator 235 is not zero, the integrator output will change and accordingly the oscillation frequency of the VCO or NCO 237 will change. When the VCO or NCO oscillation frequency is correct, the error signal output by the detector 231 will fall to zero, and the integrator output 235 will stop changing. The oscillator 237 then continues to oscillate at the correct frequency.

Where the output of the oscillator 237 is used to obtain the reference signal input to the detector 231, the reference signal may not be obtained at all if the oscillator output frequency is substantially wrong. With only a noise input to the detector 231, there is no detectable phase or frequency errors and therefore output error signal will also tend to be zero or will vary randomly, and therefore this will fail to drive the oscillator 237 through varying oscillation frequencies until the correct oscillation frequency is found. Under these circumstances, an adder 239 between the loop filter 233 and integrator 235 is used to add an offset value to the error input to the integrator 235, so that the integrator output (and therefore the oscillation frequency) will change steadily in the absence of any input error signal.

Once the output frequency of the oscillator 237 is sufficiently close to the correct frequency to generate an input signal for the detector 231, an error signal will be output by the detector 231 and passed through the loop filter 233 to the adder 239 and the integrator 235. The loop will lock when the signal input to the integrator 235 is zero, which will occur when the error signal from the loop filter 233 cancels out the search offset added in the adder 239. If the effect of the offset adder is not compensated for, this means that the loop locks at a point when the output of the oscillator 237 has a phase or frequency error sufficient to generate a cancelling error signal from the detector 231. This is disadvantageous, although the search offset can be removed once the loop has locked, so that the loop will then re-lock at the correct frequency or phase. However, if the search offset is too large, it may induce an error in the output phase or frequency of the oscillator 237 which is so large that no reference signal is generated for the detector 231. In this case, the operation of the loop may hesitate when the oscillator reaches a correct frequency, but will then pass on and fail to lock.

Accordingly, a compensation signal is applied to the detector 231. The detector 231 comprises a phase or frequency estimator 241, which outputs a complex signal vector having a phase proportional to a detected error in the phase or the frequency of the output of the oscillator 237. A simple phase error value can be obtained by outputting the magnitude of the imaginary part of this vector to the loop filter 233. In FIG. 18, the vector output by the phase or frequency error estimator 241 is multiplied by an offset compensation vector in a multiplier 243 before the value of the imaginary part of the vector is taken. The effect of this multiplication is to rotate the vector by an angle which approximately corresponds to the opposite of the error represented by the offset value added by the adder 239.

When the output of the oscillator 237 reaches the correct phase or frequency, the phase or frequency estimator 241 will output an appropriate vector. The multiplier 243 rotates this vector before the imaginary part is taken, so that the error signal output through the loop filter 233 to the adder 239 will be substantially equal but of opposite sign to the offset value added by the adder 239. Consequently, the error value input to the integrator 235 will be close to zero, and the loop will lock at close to the correct phase or frequency, even if the offset value added by the adder 239 is large. After successful locking of the loop, it is nevertheless desirable to remove both the offset value and the compensation vector, to avoid any residual inaccuracies which they may introduce.

While the output of the oscillator 237 is substantially wrong, and only noise is received by the detector 231, the estimator 241 will not output any vector at all. Under these circumstances, the multiplier 243 has no effect. Accordingly, under these circumstances the value output by the detector 231 is still zero, and the effect of the offset added by the adder 239 is not compensated for. In this way, the compensation vector applied to the detector 231 does not cancel out the effect of the offset while only noise is received and the oscillator 237 is searching for the correct phase or frequency, but the effect of the offset is cancelled once a detectable signal is received by the detector 231 so that the loop can be locked substantially without error regardless of the size of the offset. This enables a large value to be used for the offset added by the adder 239 without disrupting the ability of the loop to lock successfully. The advantage of using a large offset value is to make the oscillator 237 scan through its range of oscillation output frequencies more quickly.

In the demodulator architecture of FIG. 4, the offset and compensation vector of FIG. 18 may be used in the loops which control the mixer frequencies, in an operation to search for the carrier frequency. However, as will be appreciated by those skilled in the art, this arrangement can also be applied in many other circumstances in which an unlocked phase-locked loop or frequency-locked loop is required to perform a frequency scan.

Various embodiments of the present invention have been described by way of example. Further modifications and variations will be apparent to those skilled in the art.

I claim:

1. Apparatus for changing the data rate of a digital signal, comprising:

digital filter means for (i) receiving digital data values of an input stream of digital data values each representing the value of said digital signal at a respective moment, said input stream having a first data rate; (ii) generating therefrom digital values for an output stream of digital data values each representing the value of said digital signal at a respective moment, said output stream having a second data rate different from the first data rate, wherein each said digital data value for the output stream is equal to the sum of a plurality of product values and each said product value is equal to the product of one of said digital data values of the input stream and a respective coefficient, and (iii) selecting said coefficients for said product values in accordance with a coefficient selection signal; and control means for generating the coefficient selection signal, for selection of the coefficients for use with each said digital data value of a first one of said input stream and said output stream, from the phase of the second one of said input stream and said output stream at the respective moment of the respective digital data value of the first one of said input stream and said output stream, wherein the first one of said input stream and said output stream has a faster data rate than the second one of said input stream and said output stream.

2. Apparatus according to claim 1 in which said first one of said input stream and said output stream is the input stream, and the second one of said input stream and said output stream is the output stream.

3. Apparatus according to claim 2 in which the digital filter means comprises a plurality of accumulators and a pipeline of delays and adders, and the control means outputs, as the coefficient selection signal for use with a particular digital data value of the input stream, a digital fractional phase value representing said phase, and outputs a rollover signal once in each cycle of values of the fractional phase value from 0 to $2\pi$, and in response to the digital fractional phase value the digital filter means selects a plurality of said coefficients, obtains said product value in respect of each selected coefficient with said particular digital data value of the input stream, and accumulates each respective product value for said particular digital data value of the input stream in a respective accumulator and in response to each rollover signal the digital filter means outputs each accumulator to a respective point along the pipeline and clocks the pipeline.

4. Apparatus according to claim 2 in which the filter means comprises means for (i) selecting a plurality of coefficients for use with the same digital data value of the input stream and obtaining a plurality of said product values, for a respective plurality of digital data values of the output stream, each equal to the product of said same digital data value and a respective said coefficient which is selected for use with said same digital data value and (ii) accumulating said product values for the same digital data value of the output stream obtained in respect of a plurality of digital data values of the input stream.

5. Apparatus according to claim 2 in which the control means outputs, as the coefficient selection signal, a digital fractional phase value representing said phase as a fraction of $2\pi$.

6. Apparatus according to claim 1 in which said first one of said input stream and said output stream is the output stream, and the second one of said input stream and said output stream is the input stream.

7. Apparatus according to claim 6 in which the digital filter means comprises a pipeline of delays for receiving and delaying the digital data values of said input stream, and the control means outputs, as the coefficient selection signal for use with a particular digital data value of the output stream, a digital fractional phase value representing said phase and outputs a rollover signal once in each cycle of values of the fractional phase value from 0 to $2\pi$, and in response to the digital fractional phase value the digital filter means selects a plurality of said coefficients, obtains said product value in respect of each selected coefficient and a respective digital data value of the input stream taken from a respective point along the pipeline and adds the product values, and in response to the rollover signal the digital filter means inputs a digital data value of the input stream to the pipeline and clocks the pipeline.

8. Apparatus according to claim 6 in which the control means outputs, as the coefficient selection signal, a digital fractional phase value representing said phase as a fraction of $2\pi$.

9. Apparatus according to claim 6 in which the filter means comprises means for (i) selecting a plurality of coefficients for use with the same digital data value of the output stream and obtaining a plurality of said product values each equal to the product of a respective digital data value for the input stream and a respective one of said coefficients selected for use with said same digital data value, and (ii) adding said product values.

10. Apparatus according to claim 1 in which the control means comprises a numerically controlled oscillator for outputting a digital value representing said phase, the numerically controlled oscillator comprising a clock input for receiving a clock signal for clocking the numerically controlled oscillator and a frequency control input for receiving a digital frequency control value for controlling the oscillation frequency of the numerically controlled oscillator, and the apparatus further comprising NCO control means for providing a clock signal to the clock input of the numerically controlled oscillator at one of the first and second rates or an integer multiple or an integer sub-multiple thereof and for providing said digital frequency control value to said frequency control input of the numerically controlled oscillator to control the numerically controlled oscillator to oscillate at the other of the first and second rates or an integer multiple or an integer sub-multiple thereof.

11. Apparatus according to claim 10 in which the NCO control means is arranged to receive a signal generated from the output of the digital filter means, detect therefrom a phase or frequency error in the output of the digital filter means, and generate the digital frequency control value responsive to said phase or frequency error.

12. Apparatus according to claim 1 in which the digital filter means comprises look-up table means for receiving a first address representing the value of the coefficient selection signal and a second address representing a digital data value of the input stream and outputting the product value equal to the product of the digital data value of the input stream and a coefficient selected in accordance with the coefficient selection signal.

13. Apparatus according to claim 1 in which the digital filter means comprises store means for storing the coefficients, and multiplier means for multiplying a digital data value of the input stream with a coefficient read from the coefficient store means.

14. Apparatus according to claim 1 in which the digital filter means is a low-pass or band-pass finite impulse response filter.

15. Apparatus for modulating data symbols onto a carrier, comprising: a digital-to-analog converter; and data rate changing apparatus according to claim 1, upstream of the digital-to-analog converter, for changing the data rate of a digital signal from a first data rate which is the data rate of the data symbols or an integer multiple or an integer sub-multiple thereof to a second data rate which is the clock rate of the digital-to-analog converter of the data or an integer multiple or an integer sub-multiple thereof.

16. Apparatus for demodulating data symbols from a carrier, comprising: an analog-to-digital converter; and data rate converting apparatus according to claim 1, downstream of the analog-to-digital converter, for changing the data rate of a digital signal from a first data rate which is the clock rate of the analog-to-digital converter or an integer multiple or an integer sub-multiple thereof to a second date rate which is the data rate of the data symbols or an integer multiple or an integer sub-multiple thereof.

17. Apparatus for changing the data rate of a digital signal, comprising:

digital filter means for (i) receiving digital data values of an input stream of digital data values each representing the value of said digital signal at a respective moment, said input stream having a first data rate; (ii) generating therefrom digital values for an output stream of digital data values each representing the value of said digital signal at a respective moment, said output stream having a second data rate different from the first data rate, wherein each said digital data value for the output stream is equal to the sum of a plurality of product values and each said product value is equal to the product of one of said digital data values of the input stream and a respective coefficient, and (iii) selecting said coefficients for said product values in accordance with a coefficient selection signal; and control means for generating the coefficient selection signal, for selection of the coefficients for use with each said digital data value of the input stream, from the phase of the output stream at the respective moment of the respective digital data value of the input stream.

18. Apparatus according to claim 17 in which the control means outputs, as the coefficient selection signal, a digital fractional phase value representing said phase as a fraction of $2\pi$.

19. Apparatus according to claim 18 in which the control means also outputs a digital integer phase value representing an integer multiple of $2\pi$ in said phase.

20. Apparatus according to claim 19 which comprises an output buffer for the digital filter means, and in response to the digital fractional phase value the digital filter means selects a plurality of said coefficients, obtains said product value in respect of each selected coefficient with the respective digital data value of the input stream, and accumulates each respective product value for said respective digital data value of the input stream in a respective address of the output buffer, and generates the respective addresses using the digital integer phase value as an address offset.

21. Apparatus according to claim 19 which comprises an output buffer for the digital filter means, and in which the digital filter means comprises means for receiving the digital integer phase value and generating therefrom an address value for the output buffer.

22. Apparatus according to claim 21 in which the digital filter means steps through a series of predetermined said coefficients selecting an initial coefficient and every n-th subsequent coefficient where n is a predetermined integer and the initial coefficient is selected in response to the digital fractional phase value, and the means for generating an address value generates a plurality of address values for the output buffer using the digital integer phase value as an address offset.

23. Apparatus according to claim 17 in which the filter means comprises for (i) selecting a plurality of coefficients for use with the same digital data value of the input stream and obtaining a plurality of said product values, for a respective plurality of digital data values of the output stream, each equal to the product of said same digital data value and a respective said coefficient which is selected for use with said same digital data value and (ii) accumulating said product values for the same digital data value of the output stream obtained in respect of a plurality of digital data values of the input stream.

24. Apparatus according to claim 17 in which the digital filter means comprises a plurality of accumulators and a pipeline of delays and adders, and the control means outputs, as the coefficient selection signal for use with a particular digital data value of the input stream, a digital fractional phase value representing said phase, and outputs a rollover signal once in each cycle of values of the fractional phase value from 0 to $2\pi$, and in response to the digital fractional phase value the digital filter means selects a plurality of said coefficients, obtains said product value in respect of each selected coefficient with said particular digital data value of the input stream, and accumulates each respective product value for said particular digital data value of the input stream in a respective accumulator and in response to each rollover signal the digital filter means outputs each accumulator to a respective point along the pipeline and clocks the pipeline.

25. Apparatus according to claim 17 in which the digital filter means comprises look-up table means for receiving a first address representing the value of the coefficient selection signal and a second address representing a digital data value of the input stream and outputting the product value equal to the product of the digital data value of the input stream and a coefficient selected in accordance with the coefficient selection signal.

26. Apparatus according to claim 17 in which the digital filter means comprises store means for storing the coefficients, and multiplier means for multiplying a digital data value of the input stream with a coefficient read from the coefficient store means.

27. Apparatus according to claim 17 in which the digital filter means is a low-pass or band-pass finite impulse response filter.

28. Apparatus according to claim 17 in which the control means comprises a numerically controlled oscillator for outputting a digital value representing said phase, the numerically controlled oscillator comprising a clock input for receiving a clock signal for clocking the numerically controlled oscillator and a frequency control input for receiving a digital frequency control value for controlling the oscillation frequency of the numerically controlled oscillator, and the apparatus further comprising NCO control means for providing a clock signal to the clock input of the numerically controlled oscillator at one of the first and second rates or an integer multiple or an integer submultiple thereof and for providing said digital frequency control value to said frequency control input of the numerically controlled oscillator to control the numerically controlled oscillator to oscillate at the other of the first and second rates or an integer multiple or an integer sub-multiple thereof.

29. Apparatus according to claim 17 in which the NCO control means is arranged to receive a signal generated from the output of the digital filter means, detect therefrom a phase or frequency error in the output of the digital filter means, and generate the digital frequency control value responsive to said phase or frequency error.

30. Apparatus for modulating data symbols onto a carrier, comprising: a digital-to-analog converter; and data rate changing apparatus according to claim 17 upstream of the digital-to-analog converter, for changing the data rate of a digital signal from a first data rate which is the data rate of the data symbols or an integer multiple or an integer sub-multiple thereof to a second data rate which is the clock rate of the digital-to-analog converter or an integer multiple or an integer sub-multiple thereof.

31. Apparatus for demodulating data symbols from a carrier, comprising: an analog-to-digital converter; and data rate converting apparatus according to claim 17 downstream of the analog-to-digital converter, for changing the data rate of a digital signal from a first data rate which is the clock rate of the analog-to-digital converter or an integer multiple or an integer sub-multiple thereof to a second data rate which is the data rate of the data symbols or an integer multiple or an integer sub-multiple thereof.

32. Apparatus for changing the data rate of a digital signal comprising:

digital filter means for (i) receiving digital data values of an input stream of digital data values each representing the value of said digital signal at a respective moment, said input stream having a first data rate; (ii) generating therefrom digital values for an output stream of digital data values each representing the value of said digital signal at a respective moment, said output stream having a second data rate different from the first data rate, wherein each said digital data value for the output stream is equal to the sum of a plurality of product values and each said product value is equal to the product of one of said digital data values of the input stream and a respective coefficient, and (iii) selecting said coefficients for said product values in accordance with a coefficient selection signal; and control means for determining, for each said digital data value of the input stream the phase of the output stream at the respective moment of the respective digital data value of the input stream, and for generating the coefficient selection signal, for selection of the coefficients for use with the respective digital data value of the input stream, from said phase of the output stream, and said digital filter means comprising determining means for making a determination, in response to said phase of the output stream passing through $2\pi$ when passing from said phase of the output stream at the respective moment of one said digital data value of the input stream to said phase of the output stream at the respective moment of the next following said digital data value of the input stream, that said one digital data value of the input stream is the last digital data value of the input stream from which one said digital data value of the output stream is to be generated.

33. Apparatus according to claim 32 in which the digital filter means comprises a plurality of accumulators and a pipeline of delays and adders, and in response to the coefficient selection signal the digital filter means selects a plurality of said coefficients, obtains said product value in respect of each said selected coefficient with said respective digital data value of the input stream, and accumulates each respective product value thus obtained in a respective accumulator and in response to said determination of said determining means the digital filter means outputs each accumulator to a respective point along the pipeline and clocks the pipeline.

34. Apparatus according to claim 32 in which the digital filter means comprises look-up table means for receiving a first address representing the value of the coefficient selection signal and a second address representing a digital data value of the input stream and outputting the product value equal to the product of the digital data value of the input stream and a coefficient selected in accordance with the coefficient selection signal.

35. Apparatus according to claim 32 in which the digital filter means comprises store means for storing the coefficients, and multiplier means for multiplying a digital data value of the input stream with a coefficient read from the coefficient store means.

36. Apparatus according to claim 32 in which the digital filter means is a low-pass or band-pass finite impulse response filter.

37. Apparatus according to claim 32 in which the control means comprises a numerically controlled oscillator for outputting a digital value representing said phase, the numerically controlled oscillator comprising a clock input for receiving a clock signal for clocking the numerically controlled oscillator and a frequency control input for receiving a digital frequency control value for controlling the oscillation frequency of the numerically controlled oscillator, and the apparatus further comprising NCO control means for providing a clock signal to the clock input of the numerically controlled oscillator at one of the first and second rates or an integer multiple or an integer sub-multiple thereof and for providing said digital frequency control value to said frequency control input of the numerically controlled oscillator to control the numerically controlled oscillator to oscillate at the other of the first and second rates or an integer multiple or an integer sub-multiple thereof.

38. Apparatus according to claim 32 in which the NCO control means is arranged to receive a signal generated from the output of the digital filter means, detect therefrom a phase or frequency error in the output of the digital filter means, and generate the digital frequency control value responsive to said phase or frequency error.

39. Apparatus for modulating data symbols onto a carrier, comprising: a digital-to-analog converter; and data rate changing apparatus according to claim 32 upstream of the digital-to-analog converter, for changing the data rate of a digital signal from a first data rate which is the data rate of the data symbols or an integer multiple or an integer sub-multiple thereof to a second data rate which is the clock rate of the digital-to-analog converter or an integer multiple or an integer sub-multiple thereof.

40. Apparatus for demodulating data symbols from a carrier, comprising: an analog-to-digital converter; and data rate converting apparatus according to claim 32 downstream of the analog-to-digital converter, for changing the data rate of a digital signal from a first data rate which is the clock rate of the analog-to-digital converter or an integer multiple or an integer sub-multiple thereof to a second data rate which is the data rate of the data symbols or an integer multiple or an integer sub-multiple thereof.

41. Apparatus for changing the data rate of a digital signal, comprising:

digital filter means for (i) receiving digital data values of an input stream of digital data values each representing the value of said digital signal at a respective moment, said input stream having a first data rate; (ii) generating therefrom digital values for an output stream of digital data values each representing the value of said digital signal at a respective moment, said output stream having a second data rate different from the first data rate, wherein each said digital data value for the output stream is equal to the sum of a plurality of product values and each said product value is equal to the product of one of said digital data values of the input stream and a respective coefficient, and (iii) selecting said coefficients for said product values in accordance with a coefficient selection signal; and control means for determining, for each said digital data value of the input stream, a digital fractional phase value and a digital integer phase value for the phase of the output stream at the respective moment of the respective digital data value of the input stream, wherein said digital fractional phase value represents said phase of the output stream as a fraction of $2\pi$ and said digital integer phase value represents an integer multiple of $2\pi$ in said phase of the output stream, and for generating the coefficient selection signal, for selection of the coefficients for use with the respective digital data value of the input stream, from said digital fractional phase value, and said digital filter means comprising determining means for determining, in response to said digital integer phase value, which digital data values of the output stream are to be generated in part from the respective digital data value of the input stream.

42. Apparatus according to claim 41 which comprises an output buffer for the digital filter means, and in which the digital filter means comprises means for receiving the digital integer phase value and generating therefrom an address value for the output buffer.

43. Apparatus according to claim 41 in which the digital filter means steps through a series of predetermined said coefficients selecting an initial coefficient and every n-th subsequent coefficient where n is a predetermined integer and the initial coefficient is selected in response to the digital fractional phase value, and the means for generating an address value generates a plurality of address values for the output buffer using the digital integer phase value as an address offset.

44. Apparatus according to claim 41 which comprises an output buffer for the digital filter means, and in response to the digital fractional phase value the digital filter means selects a plurality of said coefficients, obtains said product value in respect of each selected coefficient with the respective digital data value of the input stream, and accumulates each respective product value for said respective digital data value of the input stream in a respective address of the output buffer, and generates the respective addresses using the digital integer phase value as an address offset.

45. Apparatus according to claim 41 in which the digital filter means comprises look-up table means for receiving a first address representing the value of the coefficient selection signal and a second address representing a digital data value of the input stream and outputting the product value equal to the product of the digital data value of the input stream and a coefficient selected in accordance with the coefficient selection signal.

46. Apparatus according to claim 41 in which the digital filter means comprises store means for storing the coefficients, and multiplier means for multiplying a digital data value of the input stream with a coefficient read from the coefficient store means.

47. Apparatus according to claim 41 in which the digital filter means is a low-pass or band-pass finite impulse response filter.

48. Apparatus according to claim 41 in which the control means comprises a numerically controlled oscillator for outputting a digital value representing said phase, the numerically controlled oscillator comprising a clock input for receiving a clock signal for clocking the numerically controlled oscillator and a frequency control input for receiving a digital frequency control value for controlling the oscillation frequency of the numerically controlled oscillator, and the apparatus further comprising NCO control means for providing a clock signal to the clock input of the numerically controlled oscillator at one of the first and second rates or an integer multiple or an integer sub-multiple thereof and for providing said digital frequency control value to said frequency control input of the numerically controlled oscillator to control the numerically controlled oscillator to oscillate at the other of the first and second rates or an integer multiple or an integer sub-multiple thereof.

49. Apparatus according to claim 41 in which the NCO control means is arranged to receive a signal generated from the output of the digital filter means, detect therefrom a phase or frequency error in the output of the digital filter means, and generate the digital frequency control value responsive to said phase or frequency error.

50. Apparatus for modulating data symbols onto a carrier, comprising: a digital-to-analog converter; and data rate changing apparatus according to claim 41 upstream of the digital-to-analog converter, for changing the data rate of a digital signal from a first data rate which is the data rate of the data symbol or an integer multiple or an integer sub-multiple thereof to a second data rate which is the clock rate of the digital-to-analog converter or an integer multiple or an integer sub-multiple thereof.

51. Apparatus for demodulating data symbols from a carrier, comprising: an analog-to-digital converter; and data rate converting apparatus according to claim 41 downstream of the analog-to-digital converter, for changing the data rate of a digital signal from a first data rate which is the clock rate of the analog-to-digital converter or an integer multiple or an integer sub-multiple thereof to a second data rate which is the data rate of the data symbol or an integer multiple or an integer sub-multiple thereof.

52. Apparatus for changing the data rate of a digital signal comprising:

digital filter means for (i) receiving digital data values of an input stream of digital data values each representing the value of said digital signal at a respective moment, said input stream having a first data rate; (ii) generating therefrom digital values for an output stream of digital data values each representing the value of said digital signal at a respective moment, said output stream having a second data rate different from the first data rate, wherein each said digital data value for the output stream is equal to the sum of a plurality of product values and each said product value is equal to the product of one of said digital data values of the input stream and a respective coefficient, and (iii) selecting said coefficients for said product values in accordance with a coefficient selection signal; and control means for determining, for each said digital data value of the output stream, the phase of the input stream at the respective moment of the respective digital data value of the output stream, and for generating the coefficient selection signal, for selection of the coefficients for use with the respective digital data value of the output stream, from said phase of the input stream, and said digital filter means comprising determining means for making a determination, in response to said phase of the input stream passing through $2\pi$ when passing from said phase of the input stream at the respective moment of one said digital data value of the output stream to said phase of the input stream at the respective moment of the next following said digital data value of the output stream, that said one digital data value of the output stream is the last digital data value of the output stream which is to be generated in part from one said digital data value of the input stream.

53. Apparatus according to claim 52 in which the digital filter means comprises a pipeline of delays for receiving and delaying the digital data values of said input stream, and in response to the coefficient selection signal the digital filter means selects a plurality of said coefficients, obtains said product value in respect of each selected coefficient and a respective digital data value of the input stream taken from a respective point along the pipeline and adds the product values, and in response to said determination of said determining means the digital filter means inputs a digital data value of the input stream to the pipeline and clocks the pipeline.

54. Apparatus according to claim 52 in which the digital filter means comprises look-up table means for receiving a first address representing the value of the coefficient selection signal and a second address representing a digital data value of the input stream and outputting the product value equal to the product of the digital data value of the input stream and a coefficient selected in accordance with the coefficient selection signal.

55. Apparatus according to claim 52 in which the digital filter means comprises store means for storing the coefficients, and multiplier means for multiplying a digital data value of the input stream with a coefficient read from the coefficient store means.

56. Apparatus according to claim 52 in which the digital filter means is a low-pass or band-pass finite impulse response filter.

57. Apparatus according to claim 52 in which the control means comprises a numerically controlled oscillator for outputting a digital value representing said phase, the numerically controlled oscillator comprising a clock input for receiving a clock signal for clocking the numerically controlled oscillator and a frequency control input for receiving a digital frequency control value for controlling the oscillation frequency of the numerically controlled oscillator, and the apparatus further comprising NCO control means for providing a clock signal to the clock input of the numerically controlled oscillator at one of the first and second rates or an integer multiple or an integer sub-multiple thereof and for providing said digital frequency control value to said frequency control input of the numerically controlled oscillator to control the numerically controlled oscillator to oscillate at the other of the first and second rates or an integer multiple or an integer sub-multiple thereof.

58. Apparatus according to claim 52 in which the NCO control means is arranged to receive a signal generated from the output of the digital filter means, detect therefrom a phase or frequency error in the output of the digital filter means, and generate the digital frequency control value responsive to said phase or frequency error.

59. Apparatus for modulating data symbols onto a carrier, comprising: a digital-to-analog converter; and data rate changing apparatus according to claim 52 upstream of the digital-to-analog converter, for changing the data rate of a digital signal from a first data rate which is the data rate of the data symbols or an integer multiple or an integer sub-multiple thereof to a second data rate which is the clock rate of the digital-to-analog converter or an integer multiple or an integer sub-multiple thereof.

60. Apparatus for demodulating data symbols from a carrier, comprising: an analog-to-digital converter; and data rate converting apparatus according to claim 52 downstream of the analog-to-digital converter, for changing the data rate of a digital signal from a first data rate which is the clock rate of the analog-to-digital converter or an integer multiple or an integer sub-multiple thereof to a second data rate which is the data rate of the data symbols or an integer multiple or an integer sub-multiple thereof.

61. Apparatus for changing the data rate of a digital signal, comprising:

digital filter means for (i) receiving digital data values of an input stream of digital data values each representing the value of said digital signal at a respective moment, said input stream having a first data rate; (ii) generating therefrom digital values for an output stream of digital data values each representing the value of said digital signal at a respective moment, said output stream having a second data rate different from the first data rate, wherein each said digital data value for the output stream is equal to the sum of a plurality of product values and each said product value is equal to the product of one of said digital data values of the input stream and a respective coefficient, and (iii) selecting said coefficients for said product values in accordance with a coefficient selection signal; and control means for determining, for each said digital data value of the output stream, a digital fractional phase value and a digital integer phase value for the phase of the input stream at the respective moment of the respective digital data value of the output stream, wherein said digital fractional phase value represents said phase of the input stream as a fraction of $2\pi$ and said digital integer phase value represents an integer multiple of $2\pi$ in said phase of the input stream, and for generating the coefficient selection signal, for selection of the coefficients for use with the respective digital data value of the output stream, from said digital fractional phase value, and said digital filter means comprising determining means for determining, in response to said digital integer phase value, those digital data values of the input stream from which the respective digital data value of the output stream is to be generated.

62. Apparatus according to claim 61 which comprises an input buffer for the digital filter means, and in which the digital filter means comprises means for receiving the digital integer phase value and generating therefrom an address value for the input buffer.

63. Apparatus according to claim 62 in which the digital filter means steps through a series of predetermined said coefficients selecting an initial coefficient and every n-th subsequent coefficient where n is a predetermined integer and the initial coefficient is selected in response to the digital fractional phase value, and the means for generating an address value generates a plurality of address values for the input buffer using the digital integer phase value as an address offset.

64. Apparatus according to claim 61 which comprises an input buffer for the digital filter means, and in response to the digital fractional phase value the digital filter means selects a plurality of said coefficients, reads a respective plurality of digital data values for the input stream from respective addresses of the input buffer, obtains said product value in respect of each selected coefficient and a respective one of said plurality of digital data values and adds the product values, and generates the respective addresses using the digital integer phase value as an address offset.

65. Apparatus according to claim 61 in which the digital filter means comprises look-up table means for receiving a first address representing the value of the coefficient selection signal and a second address representing a digital data value of the input stream and outputting the product value equal to the product of the digital data value of the input stream and a coefficient selected in accordance with the coefficient selection signal.

66. Apparatus according to claim 61 in which the digital filter means comprises store means for storing the coefficients, and multiplier means for multiplying a digital data value of the input stream with a coefficient read from the coefficient store means.

67. Apparatus according to claim 61 in which the digital filter means is a low-pass or band-pass finite impulse response filter.

68. Apparatus according to claim 61 in which the control means comprises a numerically controlled oscillator for outputting a digital value representing said phase, the numerically controlled oscillator comprising a clock input for receiving a clock signal for clocking the numerically controlled oscillator and a frequency control input for receiving a digital frequency control value for controlling the oscillation frequency of the numerically controlled oscillator, and the apparatus further comprising NCO control means for providing a clock signal to the clock input of the numerically controlled oscillator at one of the first and second rates or an integer multiple or an integer sub-multiple thereof and for providing said digital frequency control value to said frequency control input of the numerically controlled oscillator to control the numerically controlled oscillator to oscillate at the other of the first and second rates or an integer multiple or an integer sub-multiple thereof.

69. Apparatus according to claim 61 in which the NCO control means is arranged to receive a signal generated from the output of the digital filter means, detect therefrom a phase or frequency error in the output of the digital filter means, and generate the digital frequency control value responsive to said phase or frequency error.

70. Apparatus for modulating data symbols onto a carrier, comprising: a digital-to-analog converter; and data rate changing apparatus according to claim 61 upstream of the digital-to-analog converter, for changing the data rate of a digital signal from a first data rate which is the data rate of the data symbols or an integer multiple or an integer sub-multiple thereof to a second data rate which is the clock rate of the digital-to-analog converter or an integer multiple or an integer sub-multiple thereof.

71. Apparatus for demodulating data symbols from a carrier, comprising: an analog-to-digital converter and data rate converting apparatus according to claim 61 downstream of the analog-to-digital converter, for changing the data rate of a digital signal from a first data rate which is the clock rate of the analog-to-digital converter or an integer multiple or an integer sub-multiple thereof to a second data rate which is the data rate of the data symbols or an integer multiple or an integer sub-multiple thereof.

72. A method of changing the data rate of a digital signal, comprising:

receiving digital data values of an input stream having a first data rate, each digital data value of the input stream representing the value of the digital signal at a respective moment;

generating therefrom digital data values for an output stream having a second data rate, different from the first data rate, each digital data value of the output stream representing the value of the digital signal at a respective moment, each digital data value for the output stream being equal to the sum of a plurality of product values and each product value being equal to the product of one of said digital data values of the input stream and a respective coefficient; and selecting the coefficients for use with each said digital data value of a first one of said input stream and said output stream from the phase of the second one of said input stream and said output stream at the respective moment of the respective digital data value of the first one of input stream and said output stream, wherein the first one of the input stream and the output stream has a faster data rate than the second one of the input stream and the output stream.

73. A method of changing the data rate of a digital signal comprising:

receiving digital data values of an input stream having a first data rate, each digital data value of the input stream representing the value of the digital signal at a respective moment;

generating therefrom digital data values for an output stream having a second data rate, different from the first data rate, each digital data value of the output stream representing the value of the digital signal at a respective moment, each digital data value for the output stream being equal to the sum of a plurality of product values and each product value being equal to the product of one of said digital data values of the input stream and a respective coefficient; and selecting the coefficients for use with each said digital data value of the input stream from the phase of the output stream at the respective moment of the respective digital data value of the input stream.

74. A method of changing the data rate of a digital signal, comprising:

receiving digital data values of an input stream having a first data rate, each digital data value of the input stream representing the value of the digital signal at a respective moment;

generating therefrom digital data values for an output stream having a second data rate, different from the first data rate, each digital data value of the output stream representing the value of the digital signal at a respective moment, each digital data value for the output stream being equal to the sum of a plurality of product values and each product value being equal to the product of one of said digital data values of the input stream and a respective coefficient;

determining, for each said digital data value of the input stream, the phase of the output stream at the respective moment of the respective digital data value of the input stream;

selecting the coefficients for use with the respective digital data value of the input stream from said phase of the output stream; and determining that one said digital data value of the input stream is the last digital data value of the input stream from which one said digital data value of the output stream is to be generated, in response to said phase of the output stream passing through $2\pi$ when passing from said phase of the output stream at the respective moment of said one digital data value of the input stream to said phase of the output stream at the respective moment of the next following said digital data value of the input stream.

75. A method of changing the data rate of a digital signal, comprising:

receiving digital data values of an input stream having a first data rate, each digital data value of the input stream representing the value of the digital signal at a respective moment;

generating therefrom digital data values for an output stream having a second data rate, different from the first data rate, each digital data value of the output stream representing the value of the digital signal at a respective moment, each digital data value for the output stream being equal to the sum of a plurality of product values and each product value being equal to the product of one of said digital data values of the input stream and a respective coefficient;

determining, for each said digital data value of the input stream, a digital fractional phase value and a digital integer phase value for the phase of the output stream at the respective moment of the respective digital data value of the input stream, wherein said digital fractional phase value represents said phase of the output stream as a fraction of $2\pi$ and said digital integer phase value represents an integer multiple of $2\pi$ in said phase of the output stream;

selecting the coefficients for use with the respective digital data value of the input stream from the digital fractional phase value; and determining which digital data values of the output stream are to be generated in part from the respective digital data value of the input stream, from the digital integer phase value.

76. A method of changing the data rate of a digital signal, comprising:

receiving digital data values of an input stream having a first data rate, each digital data value of the input stream representing the value of the digital signal at a respective moment;

generating therefrom digital data values for an output stream having a second data rate, different from the first data rate, each digital data value of the output stream representing the value of the digital signal at a respective moment, each digital data value for the output stream being equal to the sum of a plurality of product values and each product value being equal to the product of one of said digital data values of the input stream and a respective coefficient;

determining, for each said digital data value of the output stream, the phase of the input stream at the respective moment of the respective digital data value of the output stream;

selecting the coefficients for use with the respective digital data value of the output stream from said phase of the input stream; and determining that one said digital data value of the output stream is the last digital data value of the output stream which is to be generated from one said digital data value of the input stream, in response to said phase of the input stream passing through $2\pi$ when passing from said phase of the input stream at the respective moment of said one digital data value of the output stream to said phase of the input stream at the respective moment of the next following said digital data value of the output stream.

77. A method of changing the data rate of a digital signal, comprising:

receiving digital data values of an input stream having a first data rate, each digital data value of the input stream representing the value of the digital signal at a respective moment;

generating therefrom digital data values for an output stream having a second data rate, different from the first data rate, each digital data value of the output stream representing the value of the digital signal at a respective moment, each digital data value for the output stream being equal to the sum of a plurality of product values and each product value being equal to the product of one of said digital data values of the input stream and a respective coefficient;

determining, for each said digital data value of the output stream, a digital fractional phase value and a digital integer phase value for the phase of the input stream at the respective moment of the respective digital data value of the output stream, wherein said digital fractional phase value represents said phase of the input stream as a fraction of $2\pi$ and said digital integer phase value represents an integer multiple of $2\pi$ in said phase of the input stream;

selecting the coefficients for use with the respective digital data value of the output stream from the digital fractional phase value; and determining those digital data values of the input stream from which the respective digital data value of the output stream is to be generated, from the digital integer phase value.

* * * * *